United States Patent
Ding et al.

(10) Patent No.: US 8,012,814 B2
(45) Date of Patent: Sep. 6, 2011

(54) METHOD OF FORMING A HIGH PERFORMANCE FET AND A HIGH VOLTAGE FET ON A SOI SUBSTRATE

(75) Inventors: Hanyi Ding, Colchester, VT (US); Kai D. Feng, Hopewell Junction, NY (US); Zhong-Xiang He, Essex Junction, VT (US); Zhenrong Jin, Essex Junction, VT (US); Xuefeng Liu, South Burlington, VT (US); Yun Shi, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 12/188,366

(22) Filed: Aug. 8, 2008

(65) Prior Publication Data

US 2010/0035390 A1    Feb. 11, 2010

(51) Int. Cl.
    *H01L 21/84* (2006.01)
(52) U.S. Cl. ...... 438/152; 438/155; 438/275; 257/E21.7
(58) Field of Classification Search .................. 438/152, 438/155, 275
    See application file for complete search history.

(56) References Cited

U.S. PATENT DOCUMENTS

| | | | |
|---|---|---|---|
| 5,473,181 A | 12/1995 | Schwalke et al. | |
| 6,509,583 B1 * | 1/2003 | Iwamatsu et al. | 257/59 |
| 6,512,269 B1 | 1/2003 | Bryant et al. | |
| 6,617,656 B2 | 9/2003 | Lee et al. | |
| 6,717,860 B1 | 4/2004 | Fujiwara | |
| 6,770,529 B2 | 8/2004 | Lee et al. | |
| 6,780,686 B2 | 8/2004 | Wei et al. | |
| 6,870,765 B2 | 3/2005 | Fujiwara | |
| 6,876,037 B2 | 4/2005 | Wei et al. | |
| 6,887,772 B2 | 5/2005 | Lee et al. | |
| 7,144,764 B2 * | 12/2006 | Matsumoto et al. | 438/151 |
| 7,320,918 B2 | 1/2008 | Campbell et al. | |
| 2004/0121547 A1 | 6/2004 | Lee et al. | |
| 2004/0156240 A1 | 8/2004 | Fujiwara | |
| 2007/0176235 A1 * | 8/2007 | Tsujiuchi et al. | 257/347 |
| 2009/0114989 A1 * | 5/2009 | Hamamoto | 257/347 |
| 2009/0261459 A1 * | 10/2009 | Oh | 257/632 |
| 2010/0084709 A1 * | 4/2010 | Tsuchiya et al. | 257/347 |

\* cited by examiner

*Primary Examiner* — Alexander G Ghyka
(74) *Attorney, Agent, or Firm* — Scully, Scott, Murphy & Presser, P.C.; Anthony J. Canale

(57) ABSTRACT

A first portion of a top semiconductor layer of a semiconductor-on-insulator (SOI) substrate is protected, while a second portion of the top semiconductor layer is removed to expose a buried insulator layer. A first field effect transistor including a gate dielectric and a gate electrode located over the first portion of the top semiconductor layer is formed. A portion of the exposed buried insulator layer is employed as a gate dielectric for a second field effect transistor. In one embodiment, the gate electrode of the second field effect transistor is a remaining portion of the top semiconductor layer. In another embodiment, the gate electrode of the second field effect transistor is formed concurrently with the gate electrode of the first field effect transistor by deposition and patterning of a gate electrode layer.

20 Claims, 23 Drawing Sheets

METHOD OF FORMING A HIGH PERFORMANCE FET AND A HIGH VOLTAGE FET ON A SOI SUBSTRATE

RELATED APPLICATIONS

The present application is related to co-pending U.S. application Ser. No. 12/188,381 filed on Aug. 8, 2008, which is incorporated herein by reference.

FIELD OF THE INVENTION

The present invention relates to methods of forming a semiconductor structure, and particularly to methods of forming a field effect transistor for high voltage application and a high performance field effect transistor on a semiconductor-on-insulator substrate.

BACKGROUND OF THE INVENTION

System-on-chip (SoC) integration requires formation of many different types of semiconductor devices on the same chip to enable various features offered by the integrated semiconductor devices. Many such SoC semiconductor chips employ semiconductor devices for power applications that are subjected to high voltages as well as high performance semiconductor devices that employ typical low supply voltages. For example, a high voltage power amplifier/switch may be employed in an SoC semiconductor chip to provide a high voltage output. Likewise, a high voltage rectifier in an SoC semiconductor chip may enable a low voltage power supply network from a high voltage power supply connected to the SoC semiconductor chip.

On one hand, to enable power semiconductor devices employing a field effect transistor, a thick gate dielectric is required. Power semiconductor devices in an SoC semiconductor chip are subjected to a high voltage, which may be in the range from about 40 V to about 120 V. To prevent dielectric breakdown, the thickness of the gate dielectric for the field effect transistor needs to be thick enough so that the electric field within the gate dielectric is less than a dielectric breakdown field strength within the gate dielectric.

On the other hand, thin gate dielectrics are preferred to enable high performance semiconductor devices on a semiconductor substrate. Particularly, the thickness of gate dielectrics comprising a silicon oxide based dielectric material is limited on a semiconductor-on-insulator (SOI) substrate since the thickness of a top semiconductor layer is finite. In many cases, the thickness of the top semiconductor layer is less than 100 nm, and even less than 50 nm to enable high performance semiconductor devices. In this case, formation of a thick silicon oxide based gate dielectric may consume the entire thickness of the top semiconductor layer, or render the remaining portion of the top semiconductor layer too thin to form a functional power semiconductor device. Formation of a high dielectric constant (high-k) gate dielectric at a sufficiently great thickness to enable a power semiconductor device is difficult, and may take excessive processing time and cost since formation of high-k gate dielectric typically employs atomic layer deposition (ALD), which has a low deposition rate.

Thus, the requirement for high performance field effect transistors and the requirement for high voltage field effect transistors for power applications are contradictory on an SOI substrate, rendering formation of an SoC semiconductor chip providing both high performance field effect transistors and high voltage field effect transistors difficult.

In view of the above, there exists a need for methods of providing a semiconductor structure including a high performance field effect transistor and a high voltage field effect transistor on a semiconductor-on-insulator (SOI) substrate without compromising the performance of the high performance field effect transistor by limiting the thickness of a top semiconductor layer or compromising the performance of the high voltage field effect transistor by limiting the thickness of a gate dielectric employed in the high voltage field effect transistor.

SUMMARY OF THE INVENTION

To address the needs described above, the present invention provides methods of forming a semiconductor structure including a high performance field effect transistor having a gate dielectric on a top surface of a top semiconductor layer and a high voltage field effect transistor having a gate dielectric that is a portion of a buried insulator layer in a semiconductor-on-insulator (SOI) substrate.

In the present invention, a first portion of a top semiconductor layer of a semiconductor-on-insulator (SOI) substrate is protected, while a second portion of the top semiconductor layer is removed to expose a buried insulator layer. A first field effect transistor including a gate dielectric and a gate electrode located over the first portion of the top semiconductor layer is formed. A portion of the exposed buried insulator layer is employed as a gate dielectric for a second field effect transistor. In one embodiment, the gate electrode of the second field effect transistor is a remaining portion of the top semiconductor layer. In another embodiment, the gate electrode of the second field effect transistor is formed concurrently with the gate electrode of the first field effect transistor by deposition and patterning of a gate electrode layer. The first field effect transistor may be a high performance device having a thin gate dielectric, while the second field effect transistor may be a high voltage device capable of handling a high voltage.

According to an aspect of the present invention, a method of forming a semiconductor structure is provided, which comprises:

masking a top semiconductor portion of a top semiconductor layer in a first device region and a portion of the semiconductor layer in a second device region of a semiconductor-on-insulator (SOI) substrate with a masking layer;

etching exposed portions of the top semiconductor layer in the second device region employing the masking layer as an etch mask, wherein a top surface of a buried insulator layer is exposed around the masked portion of the top semiconductor layer in the second device region;

forming a first hole and a second hole within the buried insulator layer around the masked portion of the top semiconductor layer in the second device region, wherein a top surface of a bottom semiconductor layer is exposed in each of the first hole and the second hole; and forming a source region and a drain region directly underneath the top surfaces of the bottom semiconductor layer, wherein the masked portion of the top semiconductor layer constitutes a gate electrode of a field effect transistor, a portion of the buried insulator layer located directly underneath the gate electrode constitutes a gate dielectric of the field effect transistor, and the source region and the drain region constitute diffusion regions of the field effect transistor, whereby current between the source region and the drain region is controlled by the gate electrode.

In one embodiment, the method further comprises forming another field effect transistor on the top semiconductor portion, wherein the other field effect transistor comprises a stack of another gate dielectric and another gate electrode located directly on a top surface of the top semiconductor portion.

According to another aspect of the present invention, a method of forming a semiconductor structure is provided, which comprises:

masking a top semiconductor portion of a top semiconductor layer in a first device region of a semiconductor-on-insulator (SOI) substrate with a masking layer;

etching exposed portions of the top semiconductor layer in the second device region employing the masking layer as an etch mask, wherein a top surface of a buried insulator layer is exposed in an entirety of the second device region;

forming a gate electrode above a portion of the top surface of the buried insulator layer in the second device region;

forming a first hole and a second hole within the buried insulator layer around the gate electrode, wherein a top surface of a bottom semiconductor layer is exposed in each of the first hole and the second hole; and forming a source region and a drain region directly underneath the top surfaces of the bottom semiconductor layer, wherein a portion of the buried insulator layer located directly underneath the gate electrode constitutes at least a portion of a gate dielectric of a field effect transistor, and the source region and the drain region constitute diffusion regions of the field effect transistor, whereby current between the source region and the drain region is controlled by the gate electrode.

In one embodiment, the method further comprises forming another field effect transistor on the top semiconductor portion, wherein the other field effect transistor comprises a stack of another gate dielectric and another gate electrode located directly on a top surface of the top semiconductor portion.

BRIEF DESCRIPTION OF THE DRAWINGS

FIG. 1 corresponds to a step after formation of a shallow trench isolation structure 38 in a top semiconductor layer 30. FIG. 2 corresponds to a step after formation of a second bottom semiconductor portion 12, which is a doped well, in a bottom semiconductor layer 10. FIG. 3 corresponds to a step after formation of a top semiconductor portion 31. FIG. 4 corresponds to a step after formation of a gate dielectric layer 50L and a gate electrode layer 52L. FIG. 5 corresponds to a step after formation of a first gate stack comprising a first gate dielectric 50 and a first gate electrode 52. FIG. 6 corresponds to a step after formation of a second gate electrode 42. FIG. 7 corresponds to a step after formation of a first dielectric gate spacer 54 and a second dielectric gate spacer 44. FIG. 8 corresponds to a step after formation of a first hole H1 and a second hole H2 in the buried insulator layer 20, which includes a second gate dielectric 20'. FIG. 9 corresponds to a step after formation of a first source region 34, a first drain region 36, a first body region 32, a second source region 14, and a second drain region 16. FIG. 10 corresponds to a step a step after formation of various metal semiconductor alloy regions. FIG. 11 corresponds to a step after formation of a middle-of-line (MOL) dielectric layer 80 and various contact vias.

FIG. 13 corresponds to a step after removal of a second prototypical top semiconductor portion 31" from the structure of FIG. 3 after masking a high performance device region P. FIG. 14 corresponds to a step after formation of a gate dielectric layer 50L and a gate electrode layer 52L. FIG. 15 corresponds to a step after formation of a first gate stack including a first gate dielectric 50 and a first gate electrode 52 and a second gate stack including a first dielectric material portion 50' and a second gate electrode 52'. FIG. 16 corresponds to a step after formation of a first dielectric gate spacer 54 and a second dielectric gate spacer 44. FIG. 17 corresponds to a step after formation of a first hole H1 and a second hole H2 in the buried insulator layer 20, which includes a second dielectric material portion 20". FIG. 18 corresponds to a step after formation of a first source region 34, a first body region 36, a first body region 32, a second source region 14, and a second drain region 16. FIG. 19 corresponds to a step a step after formation of various metal semiconductor alloy regions. FIG. 20 corresponds to a step after formation of a middle-of-line (MOL) dielectric layer 80 and various contact vias.

DETAILED DESCRIPTION OF THE INVENTION

Figure 1:
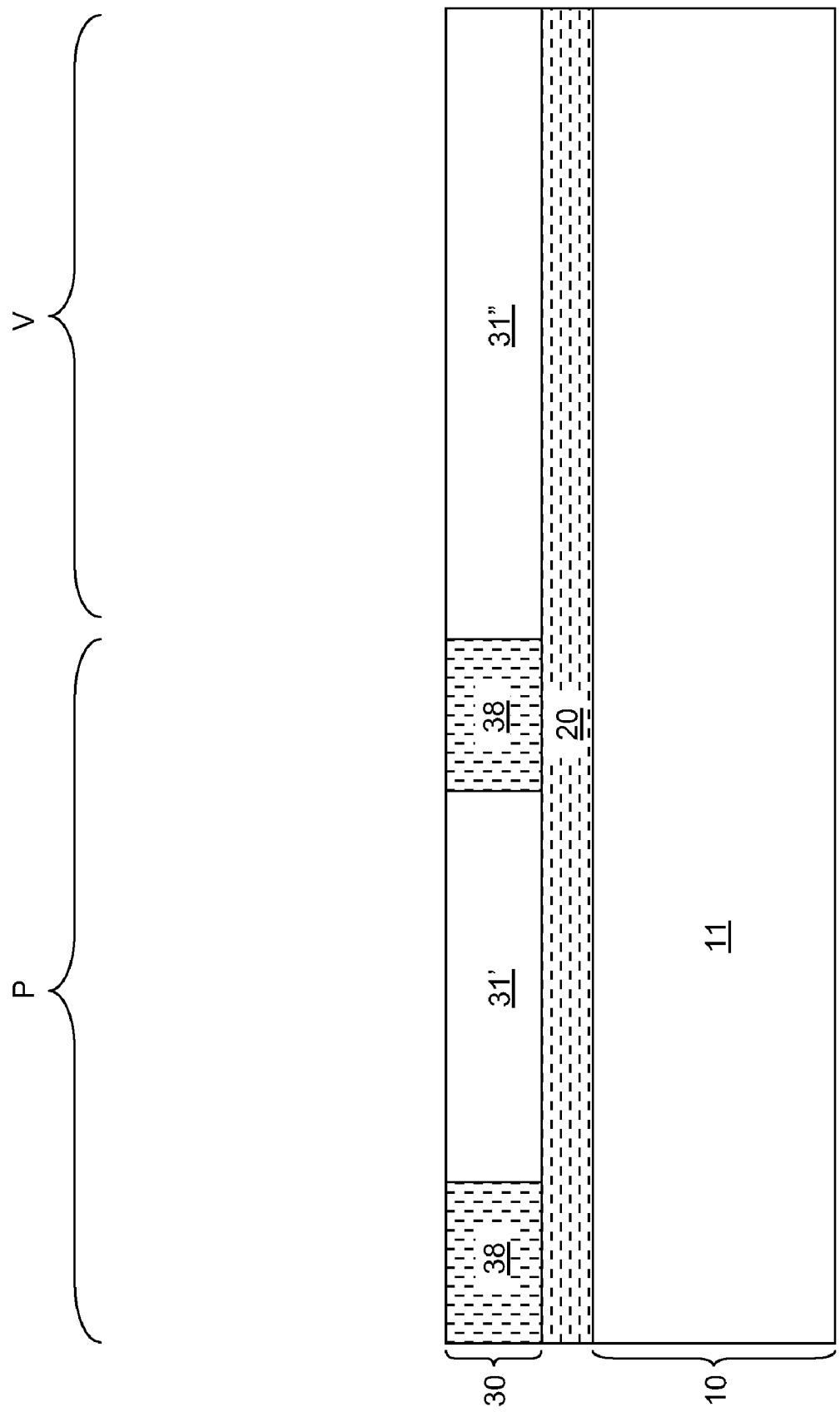
FIGS. 1-11 are sequential vertical cross-sectional views of a first exemplary semiconductor structure according to a first embodiment of the present invention.

As stated above, the present invention relates to methods of forming a field effect transistor for high voltage application and a high performance field effect transistor on a semiconductor-on-insulator substrate. As used herein, when introducing elements of the present invention or the preferred embodiments thereof, the articles "a", "an", "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary semiconductor structure according to a first embodiment of the present invention comprises a semiconductor substrate including a stack, from bottom to top, of a bottom semiconductor layer 10, a buried insulator layer 20, and a top semiconductor layer 30. The area of the semiconductor substrate (10, 20, 30) is divided into a high performance device region P and a high voltage device region V, each of which is a complement of the other. The top semiconductor layer 30 includes a first prototype top semiconductor portion 31' in the high performance device region P and a second prototype top semiconductor portion 31" in the high voltage device region V. A shallow trench isolation structure 38 comprising a dielectric material laterally abuts and surrounds the first prototype top semiconductor portion 31' in the high performance device region P.

At this step, the entirety of the bottom semiconductor layer 10 comprises a first bottom semiconductor portion 11, which may be substantially undoped or may have a p-type doping or an n-type doping. Non-limiting examples of semiconductor materials that may constitute the bottom semiconductor layer 10, the first prototype top semiconductor portion 31', and/or the second prototype top semiconductor portion 31" include silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. For example, silicon may be employed as the semiconductor material of the bottom semiconductor layer 10, the first prototype top semiconductor portion 31', and the second prototype top semiconductor portion 31".

Preferably, the bottom semiconductor layer 10 and the first prototype top semiconductor portion 31' are single crystalline, i.e., the semiconductor material is epitaxially aligned atomically within each of the entirety of the bottom semiconductor layer 10 and within the entirety of the first prototype top semiconductor portion 31'. More preferably, the first prototype top semiconductor portion 31' and the second prototype top semiconductor portion 31" are derived from a single epitaxial layer of a semiconductor material so that the entirety of the first prototype top semiconductor portion 31' and the second prototype top semiconductor portion 31" have the same set of crystallographic orientations and each of the first and second prototype top semiconductor portion (31', 31") is an epitaxially aligned single crystalline portion. The first and second prototype top semiconductor portion (31', 31") may be substantially undoped, or may be doped.

The thickness of the top semiconductor layer 10, as measured at the first prototype top semiconductor portion 31' or at the second prototype top semiconductor portion 31", may be from about 10 nm to about 300 nm, and typically from about 30 nm to about 100 nm, although lesser and greater thicknesses are also contemplated herein. The thickness of the buried insulator layer 20 may be from about 5 nm to about 300 nm, and preferably from about 10 nm to about 150 nm, and more preferably from about 20 nm to about 75 nm, although lesser and greater thicknesses are also contemplated herein.

Figure 2:
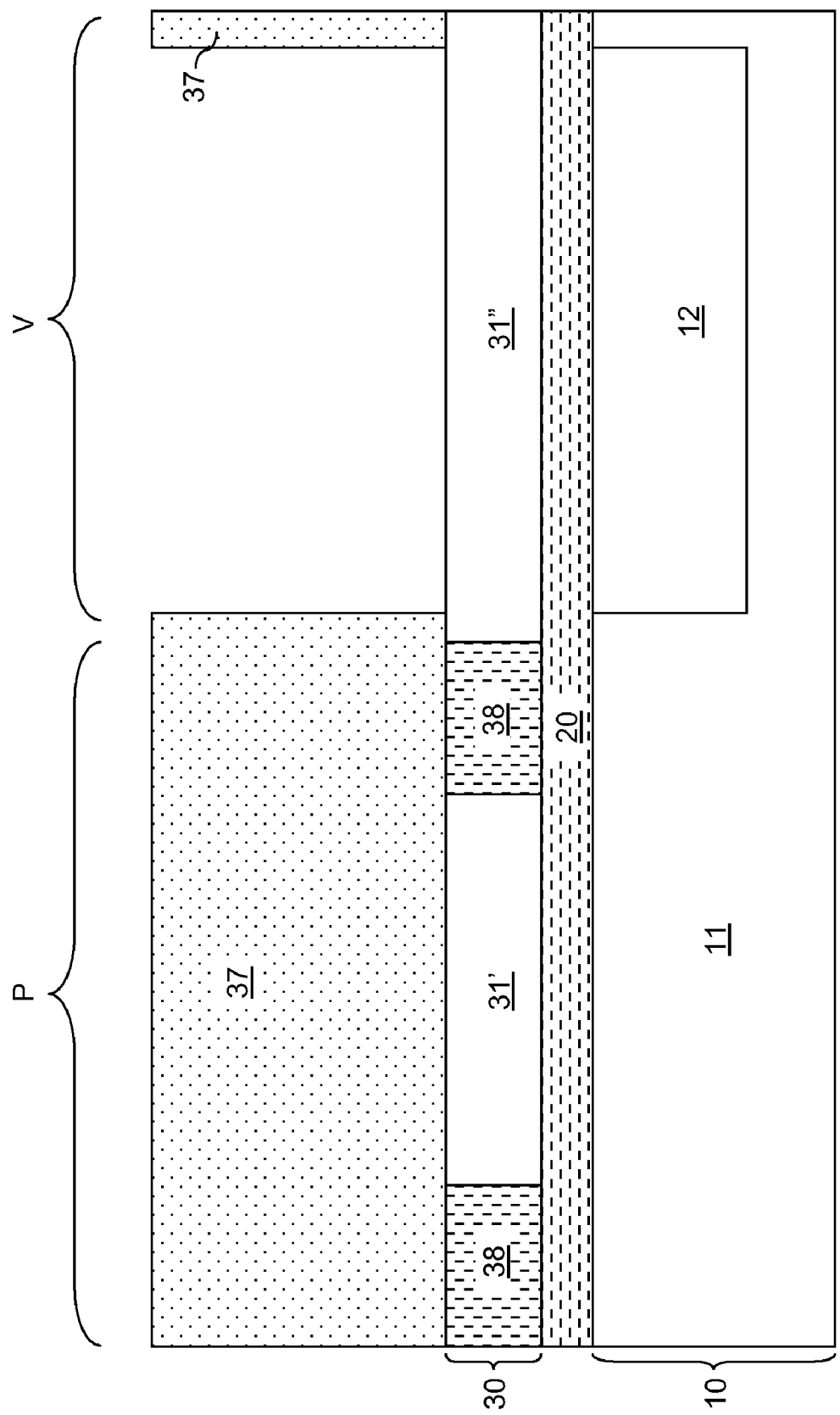

Referring to FIG. 2, a first block level photoresist 37 is applied over the top surface of the top semiconductor layer 30 and lithographically patterned to form an opening in the high voltage device region V. Dopants are implanted in the opening through the buried insulator layer 20 into an upper portion of the bottom semiconductor layer 10 to form a second bottom semiconductor portion 12 having a different dopant concentration than the unimplanted portion of the bottom semiconductor layer 10, i.e., the first bottom semiconductor portion. The type of doping of the second bottom semiconductor portion 12 is herein referred to as a first conductivity type, which may be p-type or n-type. The first bottom semiconductor portion 11 may have a doping of the first conductivity type or a doping of a second conductivity type, which is the opposite of the first conductivity type. Alternately, the first bottom semiconductor portion 11 may be substantially undoped. After formation of the second bottom semiconductor portion 12, the first block level photoresist 37 is removed, for example, by ashing.

In one embodiment, the first bottom semiconductor portion 11 has a doping of the second conductivity type and the second bottom semiconductor portion 12 has a doping of the first conductivity type so that a p-n junction is formed therebetween. By reverse biasing the p-n junction, as subsequently described in a variation of the first embodiment, the second bottom semiconductor portion 12 may be electrically biased without inducing excessive substrate leakage current.

Formation of the second bottom semiconductor portion 12 is optional. If the first bottom semiconductor portion 11 has an optimal doping for formation of a source region and a drain region of a field effect transistor, the step corresponding to FIG. 2 may be omitted, and the entirety of the bottom semiconductor layer 10 may be preserved as the first bottom semiconductor portion 11. In this case, structures subsequently formed in the second bottom semiconductor portion 12 as described below may be formed in the first bottom semiconductor portion 11 instead.

Figure 3:
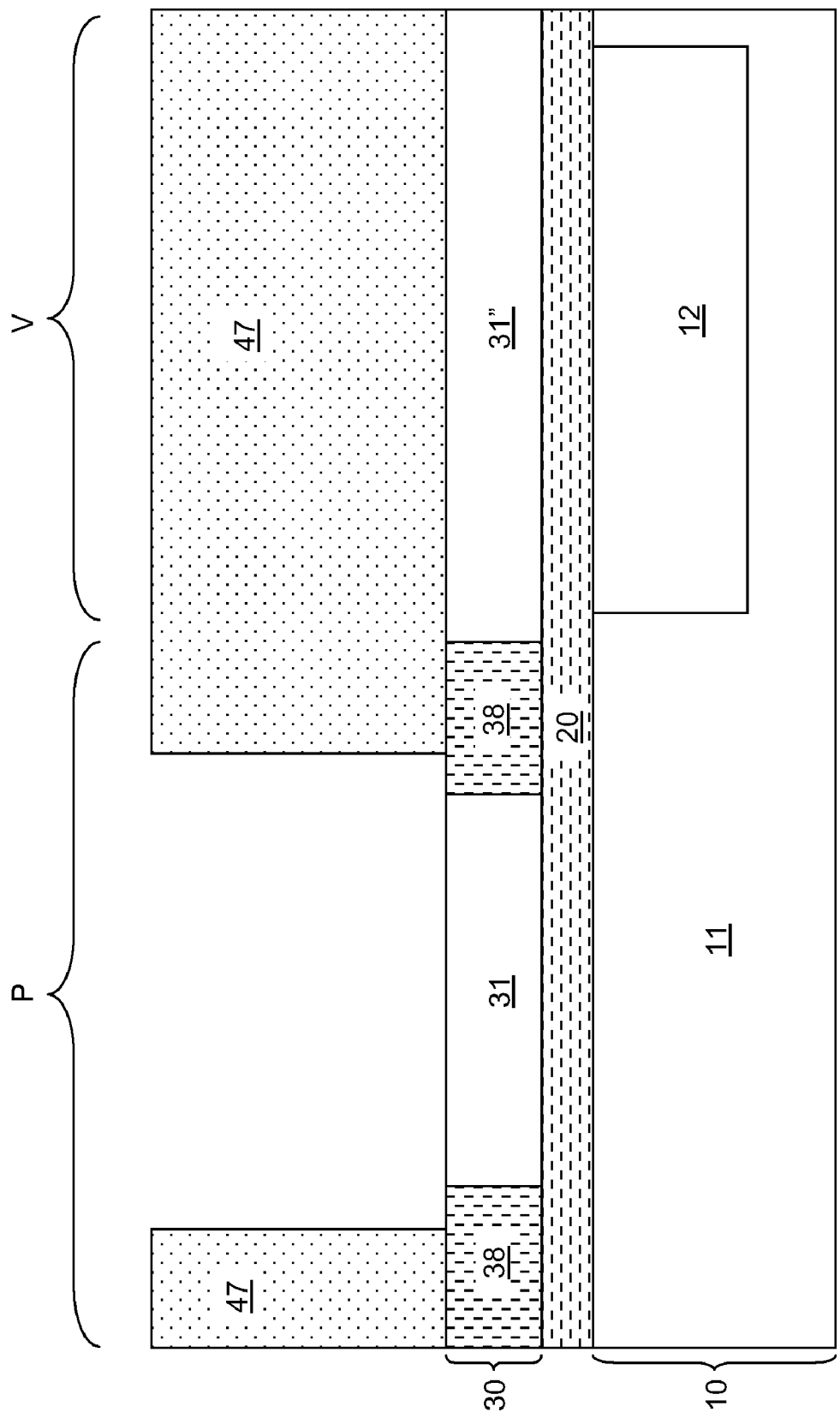

Referring to FIG. 3, a second block level photoresist 47 is applied over the top surface of the top semiconductor layer 30 and lithographically patterned to form an opening over the first prototype top semiconductor portion 31' (See FIG. 2) in the high performance device region P. The second prototype top semiconductor portion 31" in the high voltage device region V are covered with the second block level photoresist 47. Dopants are implanted in the opening into the first prototype top semiconductor portion 31' to form a first top semiconductor portion 31, which has an optimal doping concentration for a body region of a high performance field effect transistor. After formation of the first top semiconductor portion 31, the second block level photoresist 47 is removed, for example, by ashing.

If the first prototype top semiconductor portion 31' has an optimal doping concentration for a body region of a high performance field effect transistor, the step corresponding to FIG. 3 may be omitted. In this case, the first prototype top semiconductor portion 31' is identical to the first top semiconductor portion 31. Optionally, the ion implantation of dopants may be performed without applying the second block level photoresist 47, in which case the dopants are implanted without any mask into the first and second prototype top semiconductor portions (31', 32").

Figure 4:
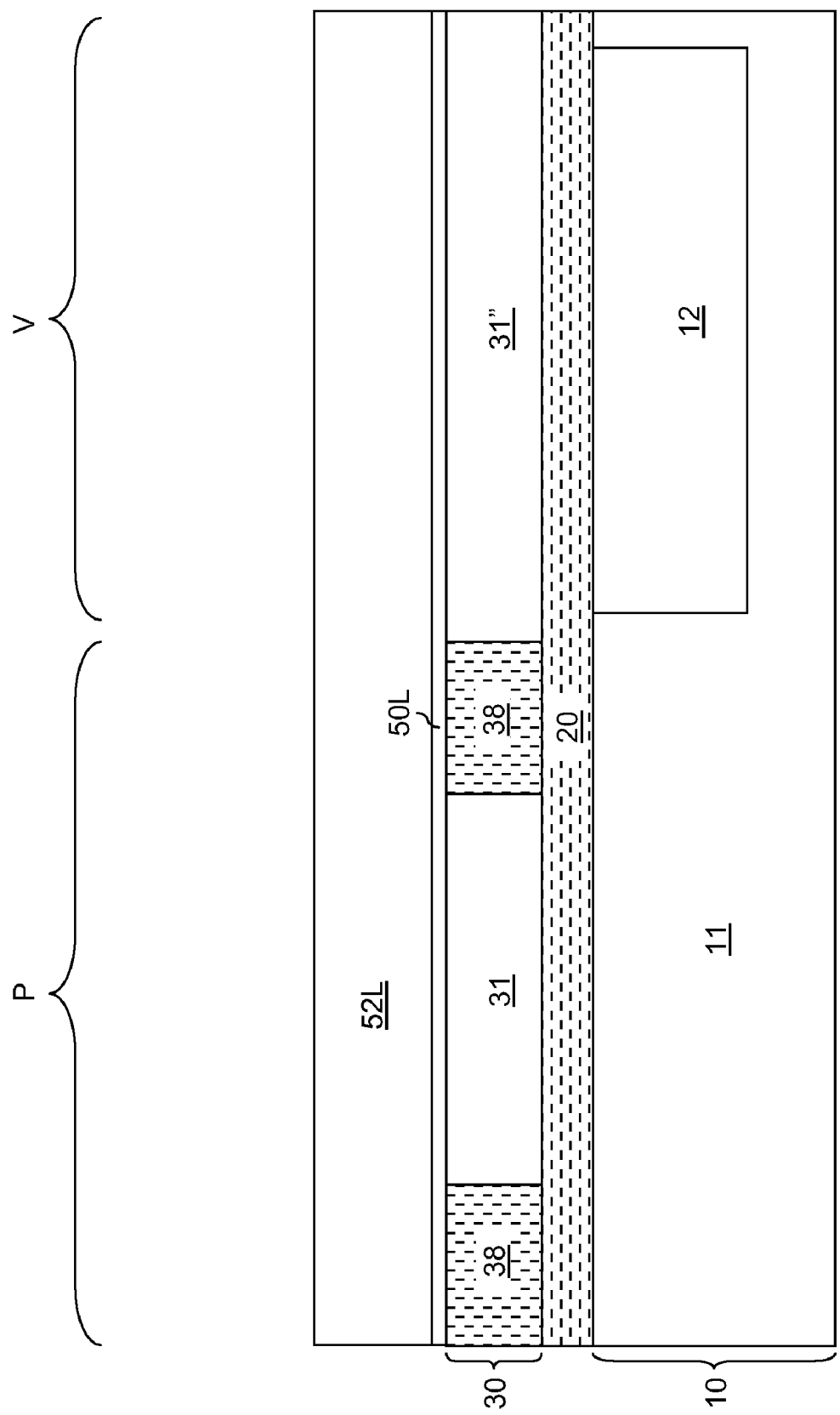

Referring to FIG. 4, a gate dielectric layer 50L is formed on a top surface of the top semiconductor layer 30, which include a top surface of the first top semiconductor portion 31, a top surface of the second prototype top semiconductor portion 31", and a top surface of the shallow trench isolation structure 38. In one case, the gate dielectric layer 50L comprises a dielectric material formed by conversion of a semiconductor material in an exposed portion of the active area into a dielectric material by thermal oxidation, thermal nitridation, plasma oxidation, plasma nitridation, or a combination thereof. For example, the first top semiconductor portion 31 and the second prototype top semiconductor portion 31" may comprise silicon and the gate dielectric layer 50L may comprise a silicon oxide based dielectric material formed by thermal conversion of silicon into a dielectric material. The silicon based dielectric material may be thermal silicon oxide or a thermal silicon oxynitride. In case the gate dielectric layer 50L comprises a silicon oxide based material, the thickness of the gate dielectric layer 50L may be from about 0.8 nm to about 10 nm, and typically from about 1.0 nm to 6 nm, although lesser and greater thicknesses are also contemplated herein.

In another case, the gate dielectric layer 50L comprises a high dielectric constant (high-k) material. The high-k dielectric material comprises a dielectric metal oxide having a dielectric constant that is greater than the dielectric constant of silicon oxide of 3.9. Typically, the high-k dielectric material has a dielectric constant greater than 8.0. Non-limiting exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The high-k dielectric material layer may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. In case the gate dielectric layer 50L comprises a high-k dielectric material, the thickness of the gate dielectric layer 50L may be from about 2 nm to about 10 nm, although lesser and greater thicknesses are also contemplated herein also.

After formation of the gate dielectric layer 50L, a gate electrode layer 52L is formed on the gate dielectric layer 50L. In one case, the gate electrode layer 52L has a polycrystalline, microcrystalline, or amorphous structure and comprises a semiconductor layer including a semiconductor material such as silicon, a silicon containing alloy, a germanium containing alloy, a III-V compound semiconductor, or a II-IV semiconductor. The semiconductor layer may be doped with at least one electrical dopant such as boron, gallium, indium, phosphorus, arsenic, antimony, or a combination thereof. The semiconductor layer may be formed by chemical vapor deposition (CVD) such as rapid thermal chemical vapor deposition (RTCVD), low pressure chemical vapor deposition (LPCVD), plasma enhanced chemical vapor deposition (PECVD). The semiconductor layer may have a thickness from about 30 nm to about 300 nm, and preferably from about 50 nm to about 200 nm, and even more preferably from about 80 nm to about 150 nm.

In another case, the gate electrode layer 52L comprises a metal layer including a conductive metallic material, which may be a metal, a metal alloy, or a metal nitride. For example, the metal layer may comprise a material such as TaN, TiN, WN, TiAlN, TaCN, other conductive refractory metal nitrides, or an alloy thereof. The conductive metallic material is also known as metal gate material in the art. The thickness of the metal layer may be from about 5 nm to about 40 nm, and preferably from about 7 nm to about 20 nm, although lesser and greater thicknesses are also contemplated herein. The metal layer may be formed, for example, by chemical vapor deposition (CVD), physical vapor deposition (PVD), atomic layer deposition (ALD), etc.

In general, the gate electrode layer 52L may comprise a semiconductor layer, a metal layer, a plurality of semiconductor layers, a plurality of metal layers, a stack of a semiconductor layer and a metal layer, or a combination thereof.

Figure 5:
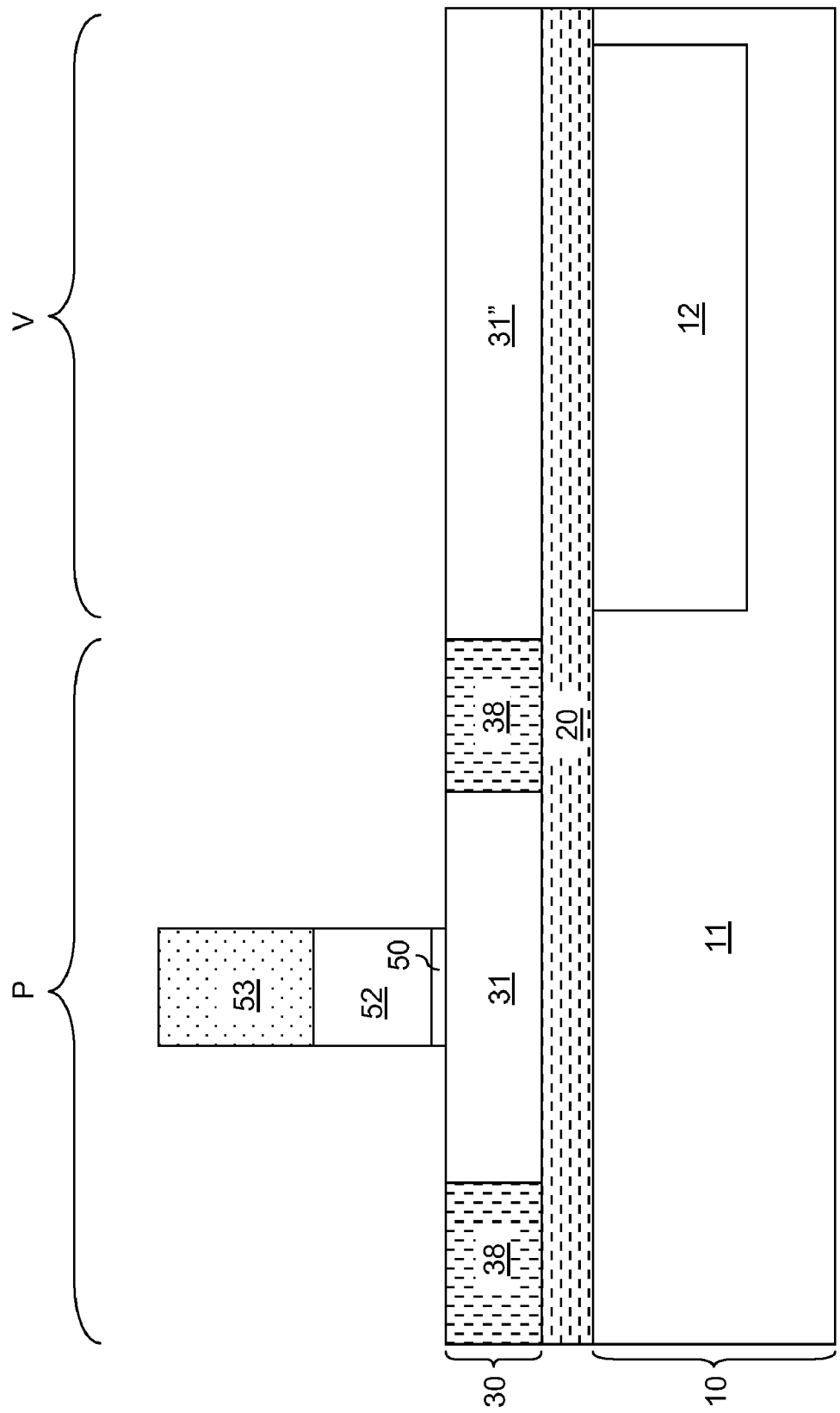

Referring to FIG. 5, a first photoresist 53 is applied over the gate electrode layer 52 and lithographically patterned in the shape of a gate electrode in the high performance device region P. The pattern in the first photoresist 53 is transferred into the gate electrode layer 52L and the gate dielectric layer 50L (See FIG. 4) by a set of at least one anisotropic etch. A first gate stack comprising a first gate dielectric 50 and a first gate electrode 52 is formed in the high performance device region P. Specifically, a remaining portion of the gate electrode layer 52L constitutes the first gate electrode 52, and a remaining portion of the gate dielectric layer 50L constitutes the first gate dielectric 50. The gate electrode layer 52L and the gate dielectric layer 50L are removed from the high voltage device region V. The first photoresist 53 is subsequently removed.

Figure 6:
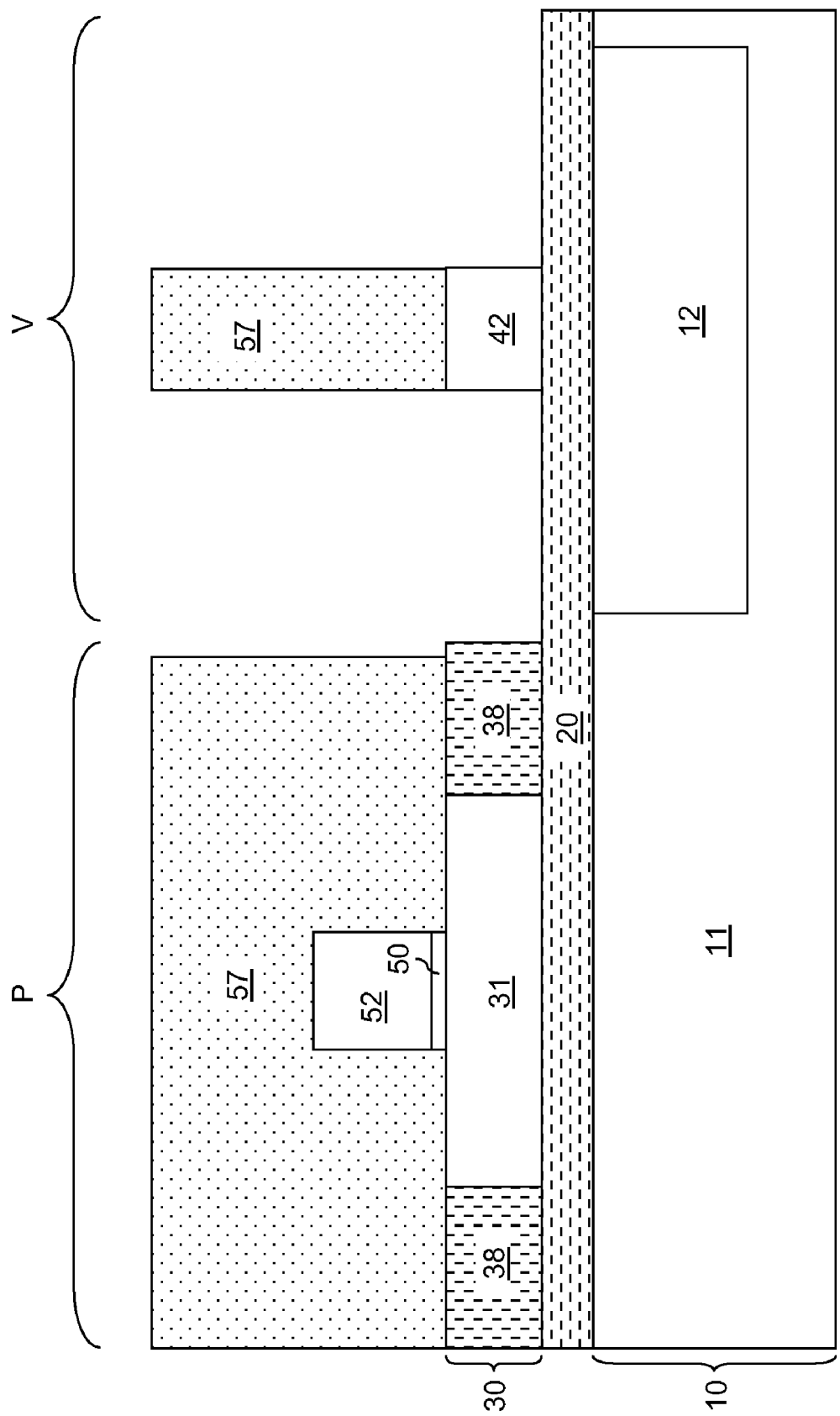

Referring to FIG. 6, a masking layer 57 is applied over the first gate stack (50, 52), the shallow trench isolation structure 38, and the second prototype top semiconductor portion 31'' (See FIG. 5) and lithographically patterned. For example, the masking layer 57 may be a photoresist. After patterning, the masking layer 57 covers the entirety of the top semiconductor portion 31 and the first gate stack (50, 52), as well as a portion of the second prototype top semiconductor portion 31'' in the high voltage device region V of the semiconductor-on-insulator (SOI) substrate (10, 20, 30). At this point, the top semiconductor portion 31, the shallow trench isolation structure 38, and the second prototype top semiconductor portion 31'' collectively constitute the top semiconductor layer 30.

The exposed portions of the top semiconductor layer 30 in the high voltage device region V is etched employing the masking layer 57 as an etch mask. Preferably, the etch is an anisotropic etch, which may be a reactive ion etch (RIE). In one embodiment, the etch removes the material of the second prototype top semiconductor portion 31'' selective to the material of the buried insulator layer 20. Not necessarily but preferably the etch is also selective to the dielectric material of the shallow trench isolation structure 38 so that overlay variations in the lithographic patterning does not affect the exposed sidewall of the shallow trench isolation structure 38.

The masked portion of the second prototype top semiconductor portion 31'' in the high voltage device region V, which is herein referred to as a second gate electrode 42, is protected by the masking layer 57 during the etch. The second gate electrode 42 functions as a gate electrode of a field effect transistor as will be subsequently described. A top surface of the buried insulator layer 20 is exposed around the second gate electrode 42, i.e., the masked portion of the second prototype top semiconductor portion 31''. The masking layer 57 is subsequently removed.

Preferably, the first top semiconductor portion 31 and the second gate electrode 42 are derived from a single crystalline semiconductor layer having a uniform thickness and located within the top semiconductor layer 30. In this case, the second gate electrode 42 and the first top semiconductor portion 31 have the same thickness, comprise the same semiconductor material, and have the same set of crystallographic orientations.

Figure 7:
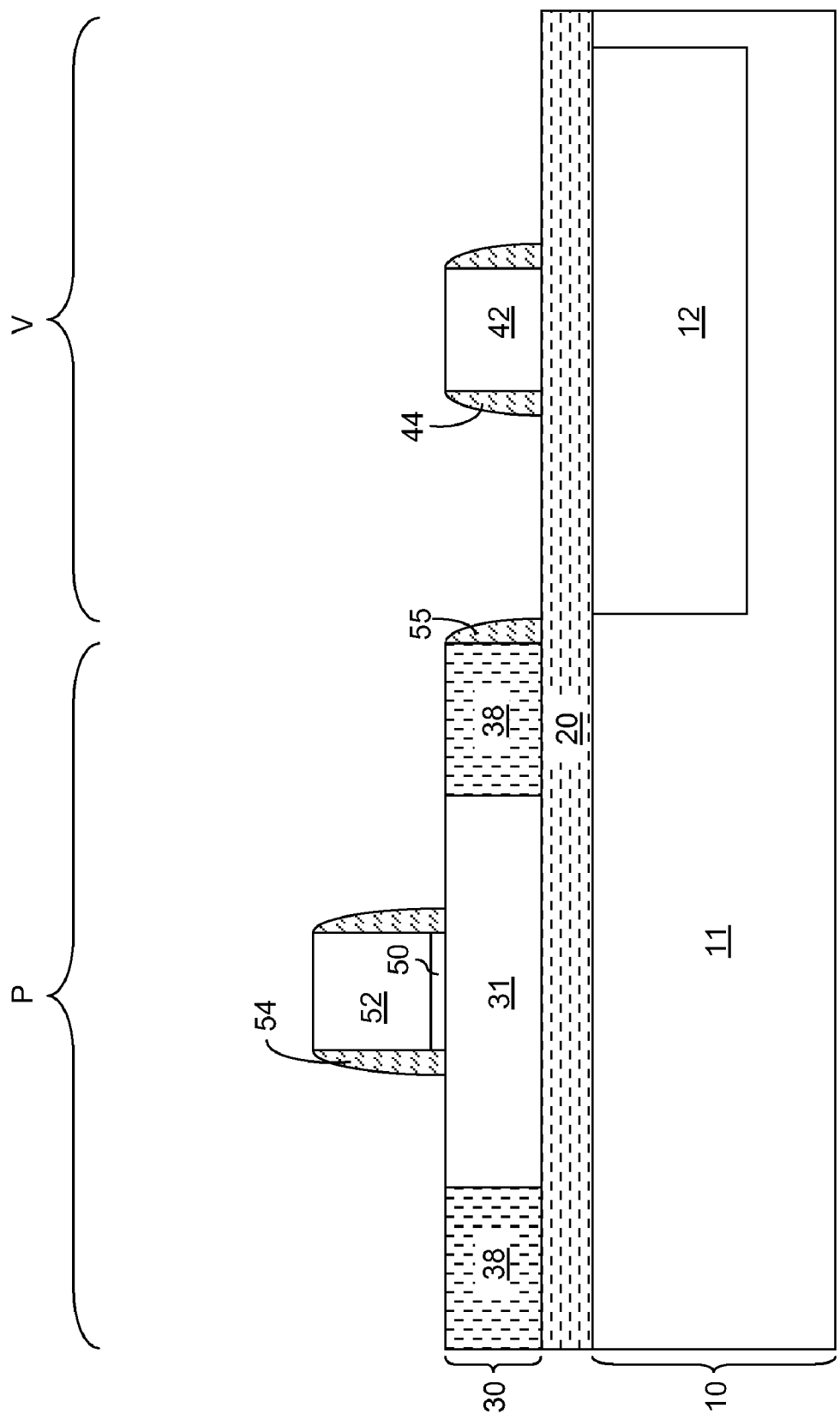

Referring to FIG. 7, halo implantations and/or source and drain extension implantations may be performed into the top semiconductor portion 31 and/or the second bottom semiconductor portion 12 with or without an implantation mask (not shown). Halo regions (not shown) and source and drain extension regions (not shown) may be formed in the top semiconductor portion 31 and/or the second bottom semiconductor portion 12. For formation of halo regions and/or source and drain extension regions in the top semiconductor portion 31, ion implantation methods known in the art may be employed, in which the first gate stack (50, 52) functions as a self-aligning ion implantation mask. For formation of halo regions and/or source and drain regions in the second bottom semiconductor portion 12, the energy of the dopant ions is increased to a sufficiently high level to enable penetration of the dopants through the buried insulator layer 20.

Subsequently, a first dielectric gate spacer 54, a second gate dielectric spacer 44, and a dielectric spacer 55 are formed by a substantially conformal deposition of a dielectric material layer (not shown), followed by an anisotropic ion etch, which removes horizontal portions of the dielectric material layer. The remaining vertical portion of the dielectric material layer on the first gate stack (50, 52) constitutes the first dielectric gate spacer 54. The remaining vertical portion of the dielectric material layer on the second gate electrode 42 constitutes the second dielectric gate spacer 44. The remaining vertical portion of the dielectric material layer on a substantially vertical sidewall of the shallow trench isolation structure at the boundary between the high performance device region P and the high voltage device region V constitutes the dielectric spacer 55.

Figure 8:
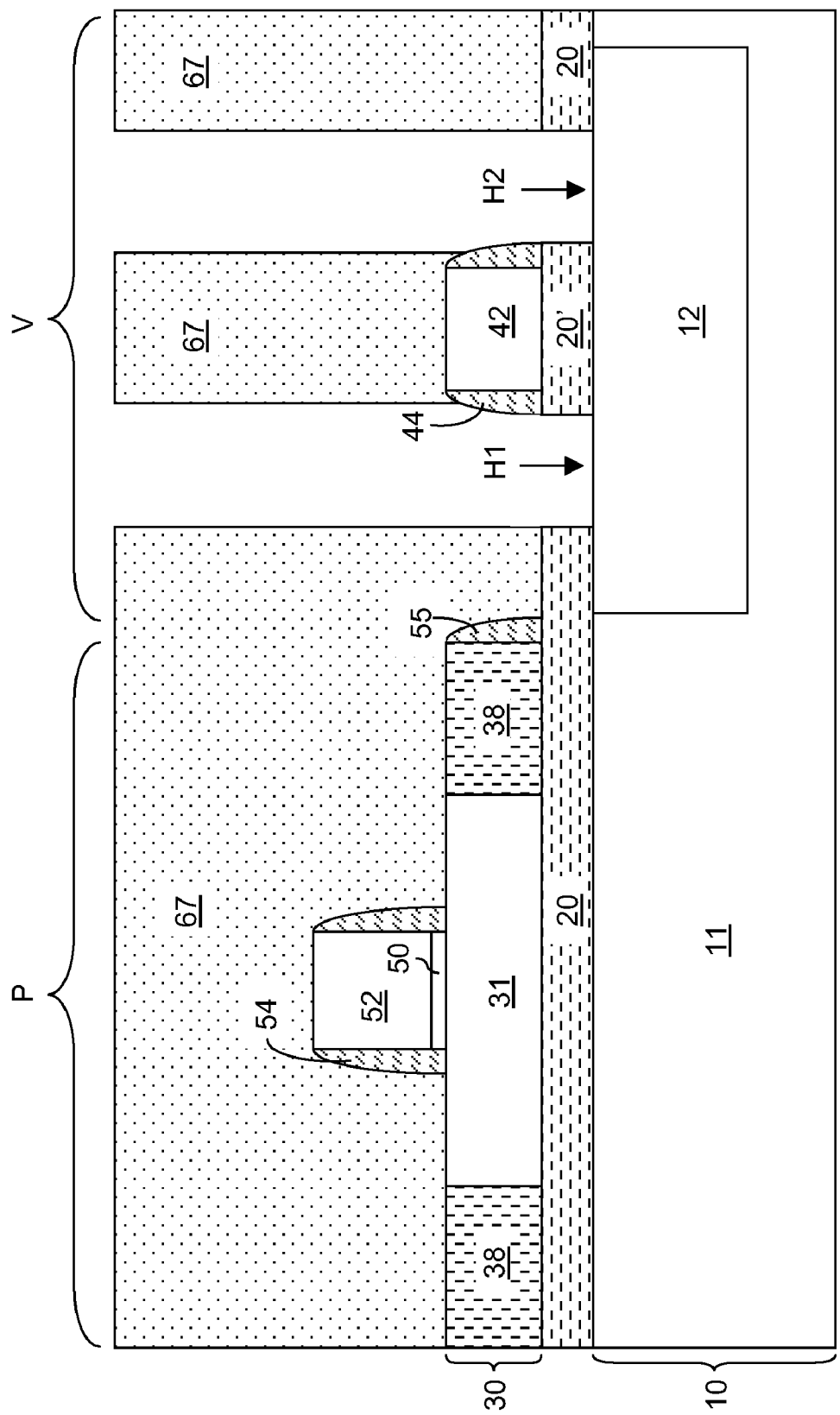

Referring to FIG. 8, a second photoresist 67 is applied over the top surfaces of the first exemplary semiconductor structure and lithographically patterned to provide at least two openings in the pattern of the second photoresist 67 in the high voltage device region V. The second photoresist 67 may cover the entirety of the high performance device region P. The at least two openings include a first opening located at one side of the second gate electrode 42 and a second opening located at an opposite side of the first opening relative to the second gate electrode 42.

Preferably, the edges of the portion of the second photoresist 67 overlying the second gate electrode 42 is located directly on the second dielectric gate spacer 44. More preferably, the thickness of the second dielectric gate spacer 44 is greater than the overlay tolerance of the lithography process employed to pattern the at least two openings in the second photoresist 67 so that the edges of the portion of the second photoresist 67 overlying the second gate electrode 42 is located directly on the second dielectric gate spacer 44 irrespective of overlay variations in the lithography process.

A first hole H1 is formed underneath the first opening in the second photoresist 67 and a second hole H2 is formed underneath the second opening in the second photoresist 67 by an etch, which is preferably an anisotropic ion etch. At least the second photoresist 67 is employed as an etch mask during the etch. Preferably, a combination of the second photoresist 67 and the second dielectric gate spacer 44 is employed as an etch mask during the etch so that a periphery of the first hole H1 and a periphery of the second hole H2 is formed self-aligned to outer edges of the second dielectric gate spacer 44. Optionally, dopant ions of the second conductivity type may be implanted into the second bottom semiconductor portion 12, which has a doping of the first conductivity type. The second photoresist 67 is subsequently removed.

The portion of the buried insulator layer 20 directly underlying the second gate electrode 42 and the second dielectric gate spacer 44 is herein referred to as a second gate dielectric 20'. The second gate dielectric 20' functions as a gate dielectric of a field effect transistor as described below. The second gate dielectric 20' is of integral construction with the rest of the buried insulator layer 20, and has the same composition and thickness as the rest of the buried insulator layer 20.

Figure 9:
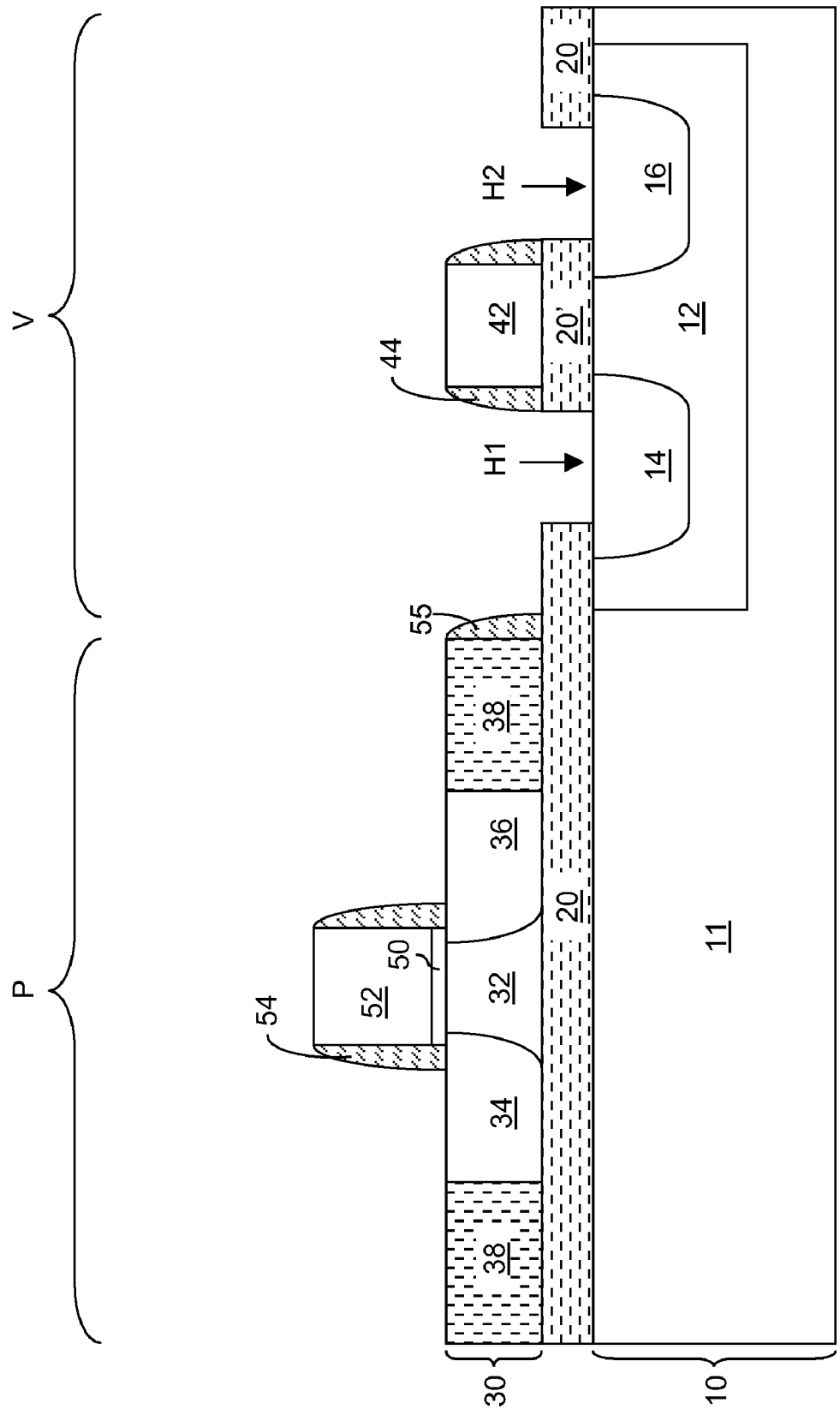

Referring to FIG. 9, various source and drain regions are formed in the first top semiconductor portion 31 (See FIG. 8) and the second bottom semiconductor portion 12 employing at least one blanket ion implantation and/or at least one masked ion implantation. Specifically, dopants of a second conductivity are implanted through the first hole H1 and the second hole H2 in the buried insulator layer 20 to form a second source region 14 that is self-aligned to the first hole H1 and a second drain region 16 that is self-aligned to the second hole H2. The remaining portion of the second bottom semiconductor portion 12, which is the doped well containing the second source region 14 and the second drain region 16 and has a doping of the first conductivity type, i.e., the opposite of the second conductivity type, constitutes a body region. A field effect transistor including the second gate electrode 42, the second gate dielectric 20' which is a portion of the buried insulator layer 20, the second source region 14, the second drain region 16, and the second bottom semiconductor portion 12 which functions as a body region is formed in the high voltage device region V. This field effect transistor is herein referred to as a second field effect transistor. The outer edges of the second dielectric gate spacer 44 is substantially vertically coincident with the sidewalls of the second gate dielectric 20', which has the same composition and thickness as the buried insulator layer 20 and is of integral construction with the buried insulator layer 20. In case formation of the second bottom semiconductor portion 12 is omitted in prior processing steps and the entirety of the bottom semiconductor layer 10 is the first bottom semiconductor portion 11, the second source region 14 and the second drain region 16 may be formed in the first bottom semiconductor portion 11.

Dopants are implanted into the first top semiconductor portion 31 (See FIG. 8) employing the first gate stack (50, 52) as a self-aligning mask to form a first source region 34 and a first drain region 36. The remaining portion of the first top semiconductor portion 31 is herein referred to as a first body region. Typically, dopants of an opposite conductivity type than the doping type of the first top semiconductor portion 31 are employed to form the first source region 34 and the first drain region 36. The remainder of the first top semiconductor portion 31 that is not implanted with dopants to form the first source region 34 and the first drain region 36 constitutes the first body region 32. Another field effect transistor including the first gate electrode 52, the first gate dielectric 50, the first source region 34, the first drain region 36, and the first body region 32 is formed in the high performance device region P. This field effect transistor is herein referred to as a first field effect transistor.

Figure 10:
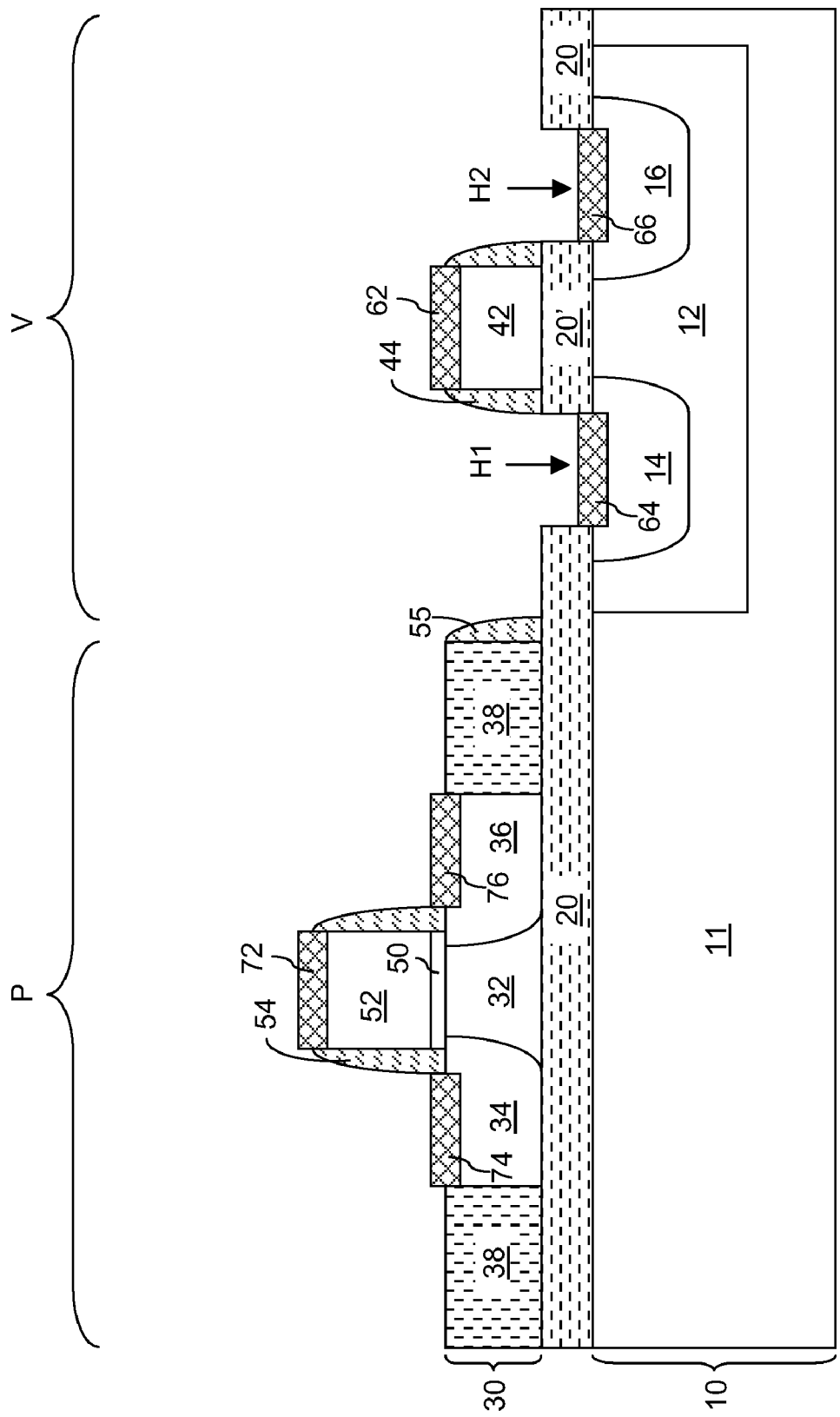

Referring to FIG. 10, various metal semiconductor alloy regions such as metal silicides may be formed on exposed semiconductor surfaces by depositing a metal layer (not shown) over the first exemplary semiconductor structure and inducing formation of such metal semiconductor alloy regions by an anneal through reaction of the metal layer with underlying semiconductor materials. The unreacted portions of the metal layer are subsequently removed selective to the metal semiconductor alloy regions and dielectric materials. The various metal semiconductor alloy regions may include a first source side metal semiconductor alloy region 74 which is formed directly on the first source region 34, a first drain side metal semiconductor alloy region 76 which is formed directly on the first drain region 36, a second source side metal semiconductor alloy region 64 which is formed directly on the second source region 14 and within the first hole H1 in the buried insulator layer 20, and a second drain side metal semiconductor alloy region 66 which is formed directly on the second drain region 16 and within the second hole H2 in the buried insulator layer 20.

Further, a second gate metal semiconductor alloy region 62 is formed directly on the second gate electrode 42 by the reaction of the metal layer with the semiconductor material in a top portion of the second gate electrode 42. Since the thickness of the first source region 34 and the second source region 36 is the same as the thickness of the second gate electrode 42 prior to formation of the various metal semiconductor portions and the metallization process consumes the same amount of semiconductor material during the anneal, the first source side metal semiconductor alloy region 74, the second drain side metal semiconductor alloy region 76, and the second gate metal semiconductor alloy region 62 may have the same thickness. In this case, the vertical distance between the first source side metal semiconductor alloy region 74 and the insulator layer 20, the vertical distance between the first drain side metal semiconductor alloy region 76 and the insulator layer 20, and the thickness of the second gate electrode 42, i.e., the vertical distance between the second gate metal semiconductor alloy region 62 and the second gate dielectric 20', are substantially the same.

In case the first gate electrode 52 comprises a semiconductor material, a first gate metal semiconductor alloy region may be formed directly on the first gate electrode 52 during the metallization process. The thickness of the various metal semiconductor alloy regions may be from about 5 nm to bout 50 nm, and typically from about 10 nm to about 25 nm, although lesser and greater thicknesses are also contemplated herein.

Figure 11:
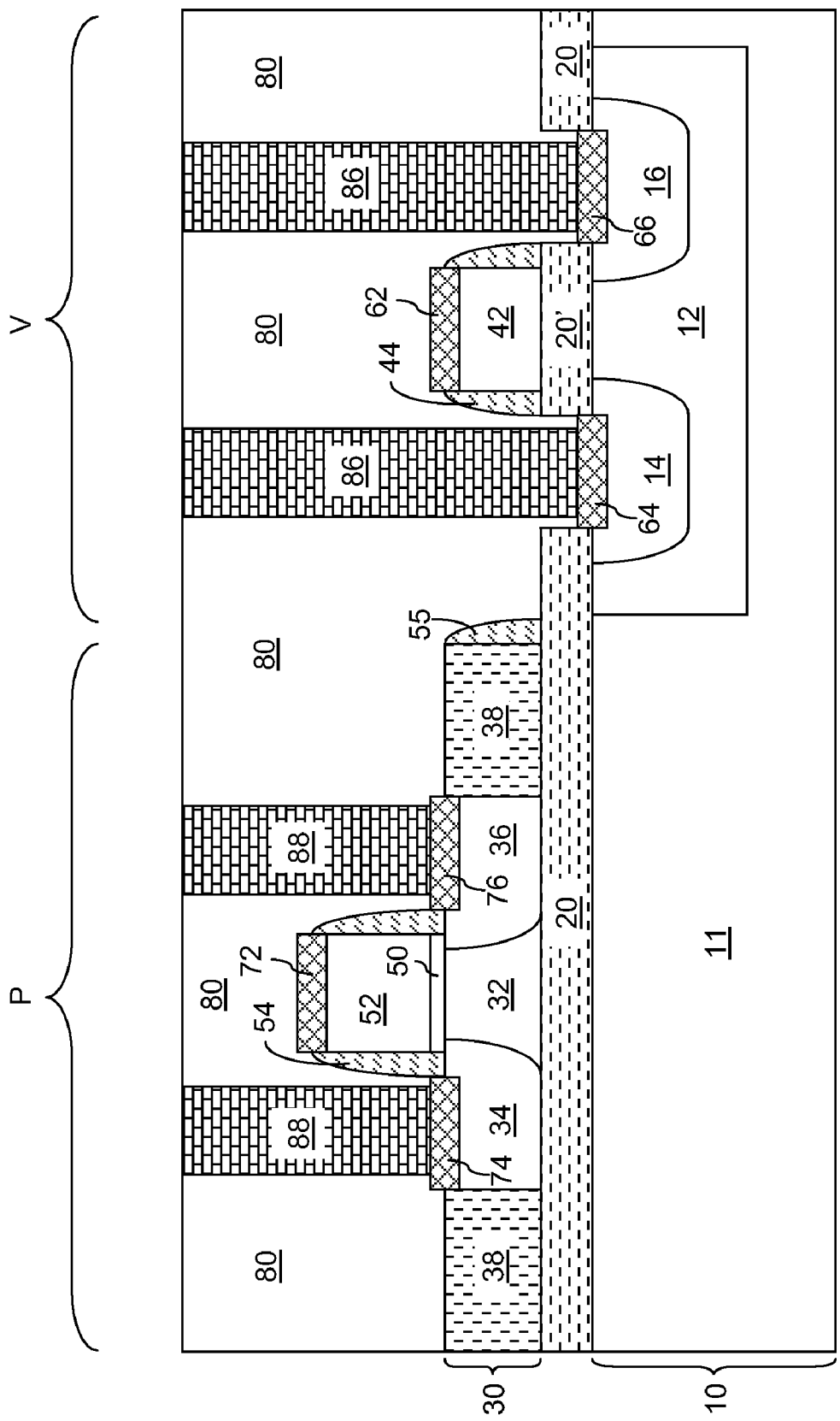

Referring to FIG. 11, a middle-of-line (MOL) dielectric layer 80 is formed over the first exemplary semiconductor structure, i.e., on the various metal semiconductor alloy regions (74, 76, 72, 64, 66, 62), the shallow trench isolation structure 38, the dielectric spacer 55, the first dielectric gate spacer 54, the second dielectric gate spacer 44, exposed sidewalls of the buried insulator layer 20, and the exposed sidewalls of the second gate dielectric 20'. The MOL dielectric layer 80 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The thickness of the MOL dielectric layer 80 may be from about 200 nm to about 500 nm. Alternately, the MOL dielectric layer 80 may comprise an organosilicate glass (OSG) having a dielectric constant value of less than 2.8. The MOL dielectric layer 80 is preferably planarized, for example, by chemical mechanical polishing (CMP). Alternately, the MOL dielectric layer may be a self-planarizing material such as a spin-on glass (SOG) or a spin-on low-k dielectric material such as SiLK™.

Various contact via holes are formed in the MOL dielectric layer 80 and filled with metal to form various contact vias. The formation of the various contact via holes may be effected by applying a photoresist (not shown) over the MOL dielectric layer 80 and lithographically patterning the photoresist to form a pattern of via holes. The pattern of the via holes is transferred into the MOL dielectric layer by an anisotropic etch, which is preferably selective to the various metal semiconductor alloy portions to accommodate the differences in the height of the via holes to be formed in the MOL dielectric layer 80. A conductive material such as doped polysilicon or a metal is deposited into the via holes, for example, by chemical vapor deposition (CVD). Excess conductive material over the top surface of the MOL dielectric layer 80 is removed by a recess etch, a planarization process, or a combination thereof to form the various contact vias.

Specifically, a first contact via 88 is formed on the first source side metal semiconductor alloy region 74 and another first contact via 88 is formed on the first drain side metal semiconductor alloy region 76. A second contact via 86 is formed on the second source side metal semiconductor alloy region 64 and another second contact via 86 is formed on the second drain side metal semiconductor alloy region 66. Other contact vias (not shown) are formed on the first gate metal semiconductor alloy region 72 and the second gate metal semiconductor alloy region 62. The second contact vias 86 have a greater height than the first contact vias 88. The difference in the heights of the second contact vias 86 and the first contact vias is substantially equal to the sum of the thickness of the top semiconductor layer 30 and the thickness of the buried insulator layer 20.

The first exemplary semiconductor structure includes the first field effect transistor in the high performance device region P and the second field effect transistor in the high voltage device region V. The first field effect transistor may be optimized for performance, i.e., for high speed operation, which is effected at normal transistor operation voltages, e.g., voltages in the range from about 0.8 V to about 3.5V. The second field effect transistor may be optimized for high voltage operation to withstand high voltages, i.e., voltages above normal transistor operation voltages, which may include a voltage range from about 10 V to about 120 V, and typically a voltage range from about 40 V to about 120 V. Since the first gate dielectric 50 and the second gate dielectric 20' are formed independently, the performance parameters of the first field effect transistor and the performance parameters of the second field effect transistor may be optimized independently.

Further, since the thickness of the second gate dielectric 20' may be increased by increasing the thickness of the buried insulator layer and typical silicon oxide based gate dielectric can withstand an electric field strength of about 10 MV/cm without dielectric breakdown, the maximum voltage that may be applied to the second field effect transistor may be increased beyond the voltage range enabled by conventional field effect transistors. For example, if the thickness of the second gate dielectric 20' (and the thickness of the buried insulator layer 20) is set at 300 nm and the material of the second gate dielectric 20' (and the buried insulator layer 20) comprises silicon oxide based dielectric material, the second gate dielectric may withstand a voltage bias of about 300 V. Thus, the second field effect transistor is capable of handling a very high voltage, e.g., up to 300 V, which is not enabled by conventional field effect transistors formed on a semiconductor-on-insulator (SOI) substrate.

Figure 12:
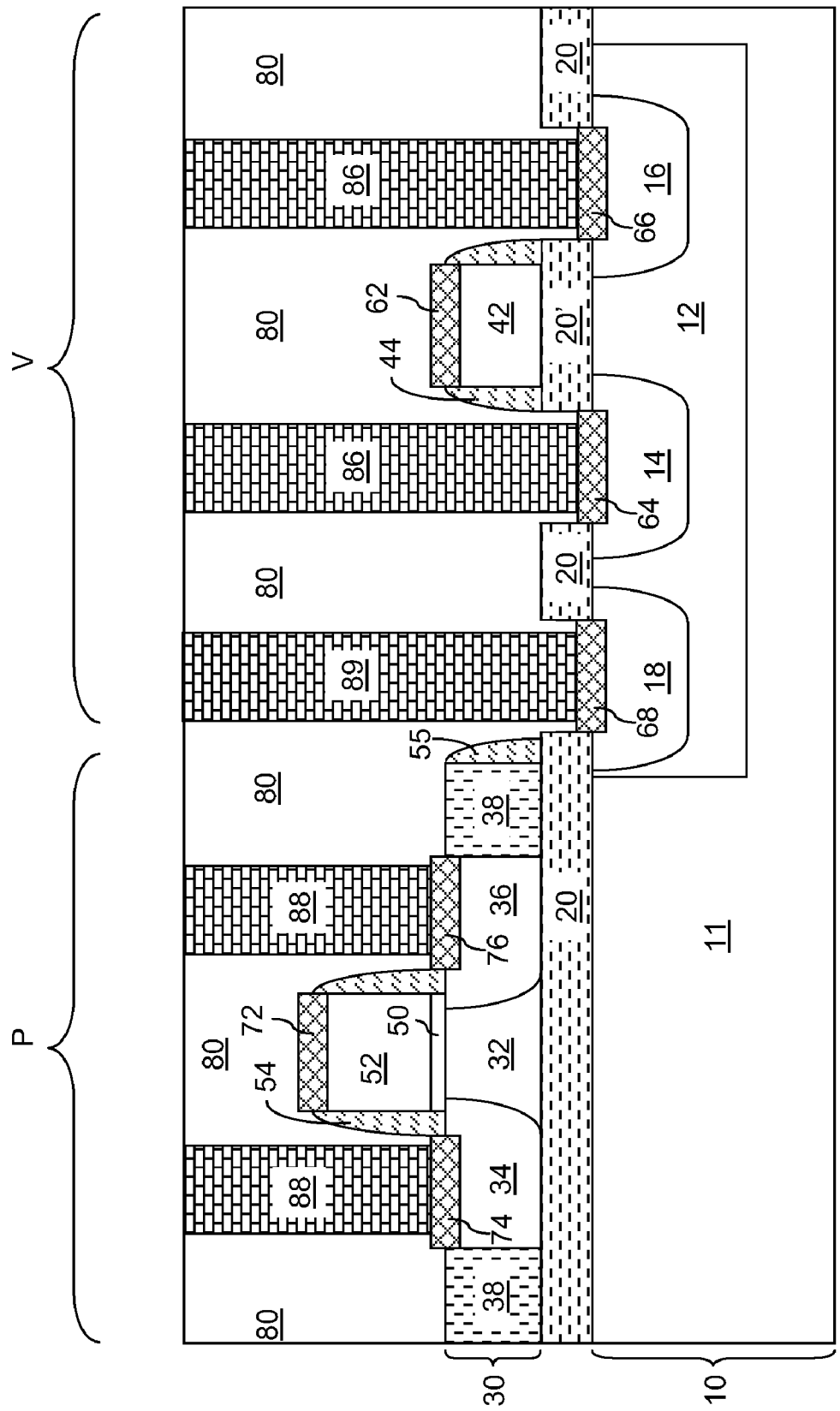
FIG. 12 is a vertical cross-sectional view of a variation of the first exemplary semiconductor structure.

Referring to FIG. 12, a variation of the first exemplary semiconductor structure includes a heavily doped semiconductor region 18 formed in an upper portion of the second bottom semiconductor portion 12, a substrate metal semiconductor alloy region 68 formed directly on the heavily doped semiconductor region 18, and a substrate contact via 89 formed directly on the substrate metal semiconductor alloy region 68. To form the heavily doped semiconductor region 18, dopants of the first conductivity type, an additional hole is formed in the buried insulator layer 20 at a step corresponding to FIG. 8 in the high voltage device region V, and dopants of the first conductivity type, i.e., dopants of the same conductivity type as the second bottom semiconductor portion 12, are implanted into an upper portion of the second bottom semiconductor portion 12 through the additional hole at a step corresponding to FIG. 9. The heavily doped semiconductor region 18 is heavily doped to provide Ohmic contact between the second bottom semiconductor portion 12 and the substrate metal semiconductor alloy region 68, and may have a dopant concentration from about $5.0 \times 10^{19}/cm^3$ to about $1.0 \times 10^{21}/cm^3$, and typically from about $1.0 \times 10^{20}/cm^3$ to about $5.0 \times 10^{20}/cm^3$. The substrate metal semiconductor alloy region 68 is formed by reacting the metal layer with the exposed portion of the heavily doped semiconductor region 18 within the additional hole in the buried insulator layer 20. An additional via hole is formed over the substrate metal semiconductor alloy region 68 at a step corresponding to FIG. 11 and filled with a conductive material to form the substrate contact via 89. The second bottom semiconductor portion 12, which is a doped well containing a body region of the second field effect transistor, may be biased to optimize the performance of the second field effect transistor through the substrate contact via 89.

Figure 13:
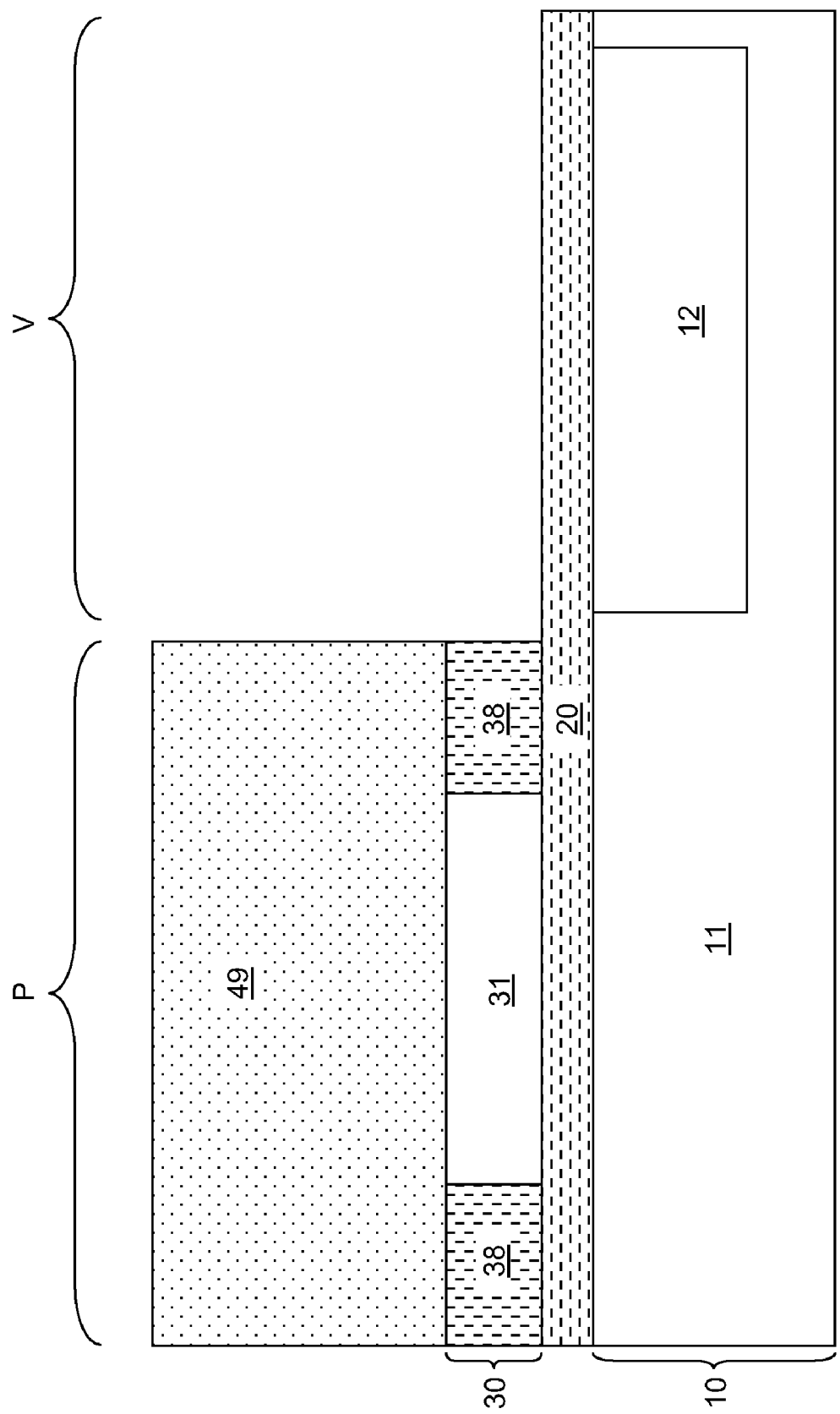
FIGS. 13-20 are sequential vertical cross-sectional views of a second exemplary semiconductor structure according to a second embodiment of the present invention.

Referring to FIG. 13, a second exemplary semiconductor structure according to a second embodiment of the present invention is derived from the first exemplary semiconductor structure of FIG. 13 by removing the second block level photoresist 47 and applying and lithographically patterning a third block level photoresist 49. The third block level photoresist 49 is patterned to cover the entirety of the high performance device region P, while exposing the entirety of the high voltage device region V. The edge of the third block level photoresist 49 after lithographic patterning may, or may not coincide with an edge of the shallow trench isolation structure 38. Employing the third block level photoresist 49 as an etch mask, the exposed semiconductor material in the high voltage device region V, i.e., the entirety of the second prototype top semiconductor portion (See FIG. 3) is removed by an etch, which may be an anisotropic etch, such as a reactive ion etch or chemical downstream etch, or an isotropic etch such as a wet etch. Preferably, the etch is selective to the buried insulator layer 20. The etch may also be selective to the shallow trench isolation structure 38, in which case the overlay variations in the lithographic patterning of the third block level photoresist 49 is irrelevant in determining the located of an exposed sidewall of the shallow trench isolation structure 38 after the etch. The third block level photoresist 49 is subsequently removed. The top surface of the second exemplary semiconductor structure includes a "step" between the high performance device region P and the high voltage device region V, which has a height that is substantially equal to the thickness of the top semiconductor layer 30.

Figure 14:
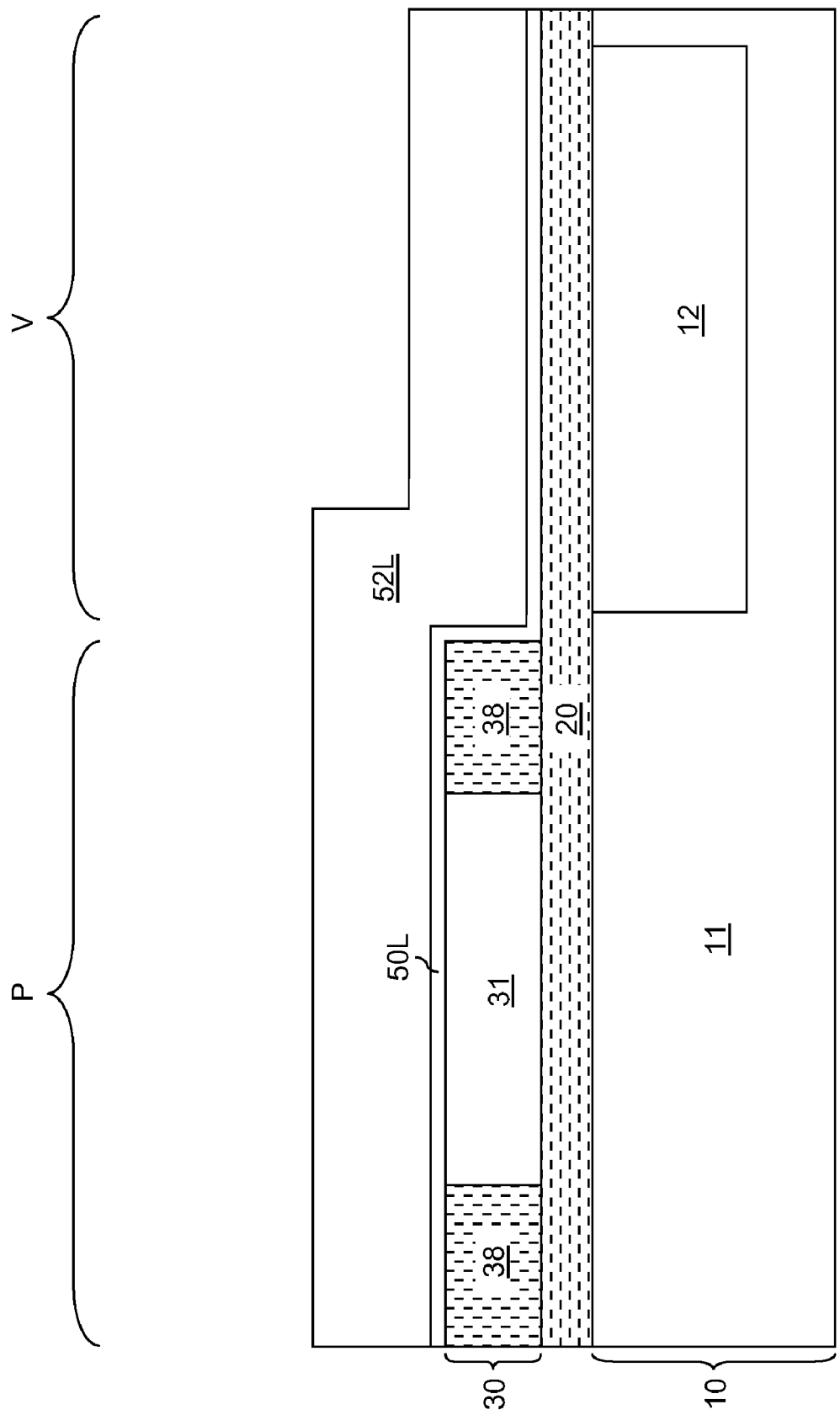

Referring to FIG. 14, a gate dielectric layer 50L and a gate electrode layer 52L are formed on the top surface of the second exemplary semiconductor structure, which include the top surface of the first top semiconductor portion 31, the top surface and sidewall of the shallow trench isolation structure 38, and exposed surfaces of the buried insulator layer in the high voltage device region V. The gate dielectric layer 50L may have the same thickness and composition as in the first embodiment, and may be formed employing the same methods as in the first embodiment. Similarly, the gate electrode layer 52L may have the same thickness and composition as in the first embodiment, and may be formed employing the same methods as in the first embodiment. The step in the surface of the second exemplary semiconductor structure prior to formation of the gate dielectric layer 50L is replicated on the exposed surfaces of the gate electrode layer 52L.

While the present invention is described with a gate dielectric layer 50L that is formed on the entirety of the top surface of the first top semiconductor portion 31, the exposed surfaces of the shallow trench isolation structure 38, and the exposed surfaces of the buried insulator layer 20, which is the case if the gate dielectric layer 50L is formed by deposition of material, e.g., a high-k dielectric material, it is understood that the gate dielectric layer 50L may be formed only on the top surface of the first semiconductor portion 31 if the gate dielectric layer 50L is formed by thermal or plasma conversion of an exposed semiconductor material into a dielectric material such as silicon oxide, silicon nitride, or silicon oxynitride.

Figure 15:
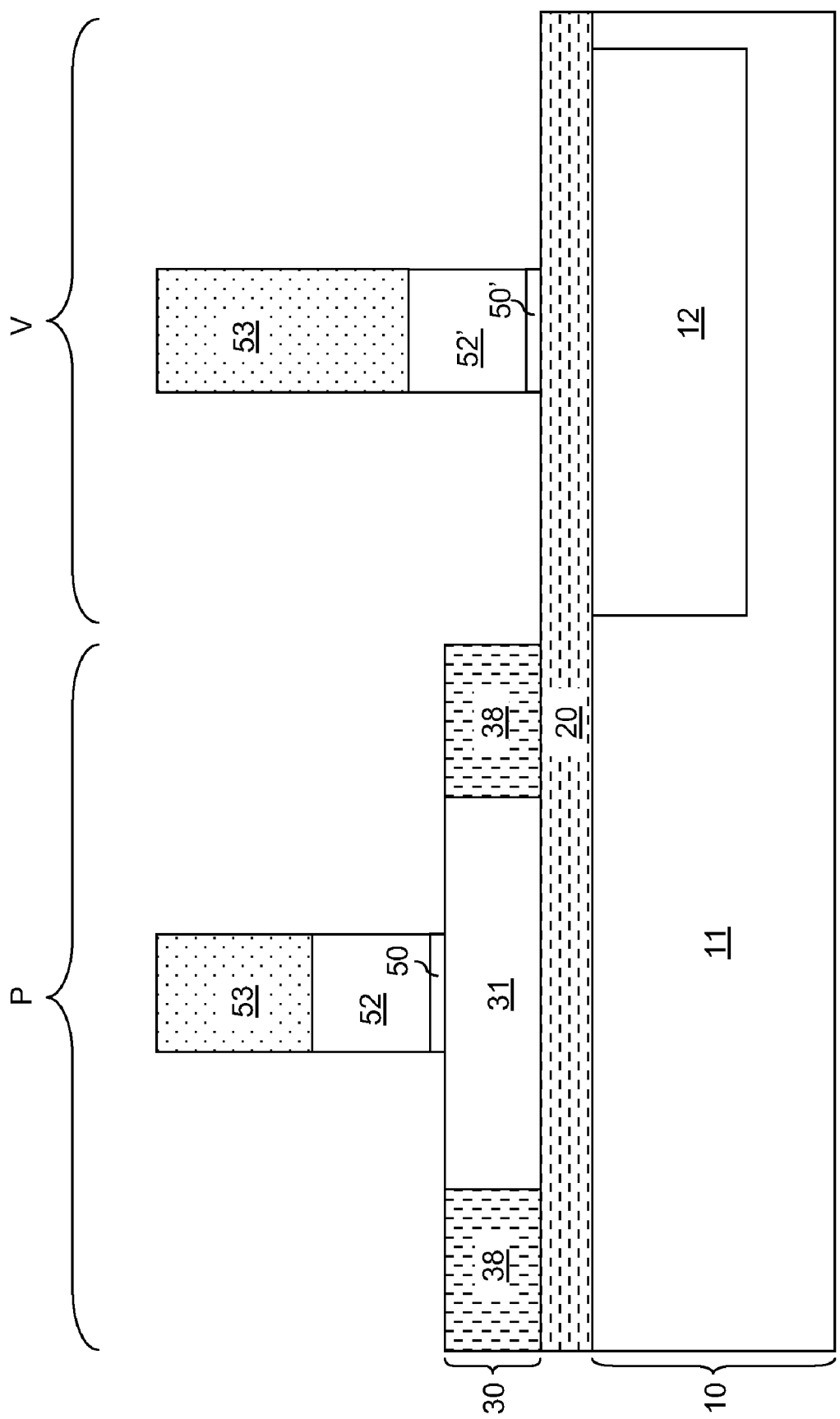

Referring to FIG. 15, a first photoresist 53 is applied over the gate electrode layer 52 and lithographically patterned in the shape of a first gate electrode in the high performance device region P and in the shape of a second gate electrode in the high voltage device region V. The pattern in the first photoresist 53 is transferred into the gate electrode layer 52L and the gate dielectric layer 50L (See FIG. 14) by a set of at least one anisotropic etch. A first gate stack comprising a first gate dielectric 50 and a first gate electrode 52 is formed in the high performance device region P. A stack comprising a dielectric material portion 50' and a second gate electrode 52' is formed in the high voltage device region V. Specifically, a remaining portion of the gate electrode layer 52L in the high performance device region P constitutes the first gate electrode 52, and a remaining portion of the gate dielectric layer 50L in the high performance device region P constitutes the first gate dielectric 50. A remaining portion of the gate electrode layer 52L in the high voltage device region V constitutes the second gate electrode 52', and a remaining portion of the gate dielectric layer 50L in the high voltage device region V constitutes the dielectric material portion 50'. The gate electrode layer 52L and the gate dielectric layer 50L are removed from area of the high voltage device region V that is not covered with the first photoresist 53. The first photoresist 53 is subsequently removed.

It is understood that in case the gate dielectric layer 50L is formed only on the top surface of the first top semiconductor portion 31 and not on the surfaces of the shallow trench isolation structure 38 or the buried insulator layer 20, the dielectric material portion 50' is not formed and the second gate electrode 52' is formed directly on the buried insulator layer 20. Such variations are explicitly contemplated herein.

Since the first gate dielectric 50 and the dielectric material portion 50' are formed from remaining portions of the same gate dielectric layer 50L, the first gate dielectric 50 and the dielectric material portion 50' have the same thickness and composition. Likewise, since the first gate electrode 52 and the second gate electrode 52' are formed from remaining portions of the same gate electrode layer 52L, the first gate electrode 52 and the second gate electrode 52' have the same thickness and composition at this step. Additional dopants may be introduced into the first gate electrode 52 and/or the second gate electrode 52' to adjust the work function(s) of field effect transistors to be subsequently formed.

Figure 16:
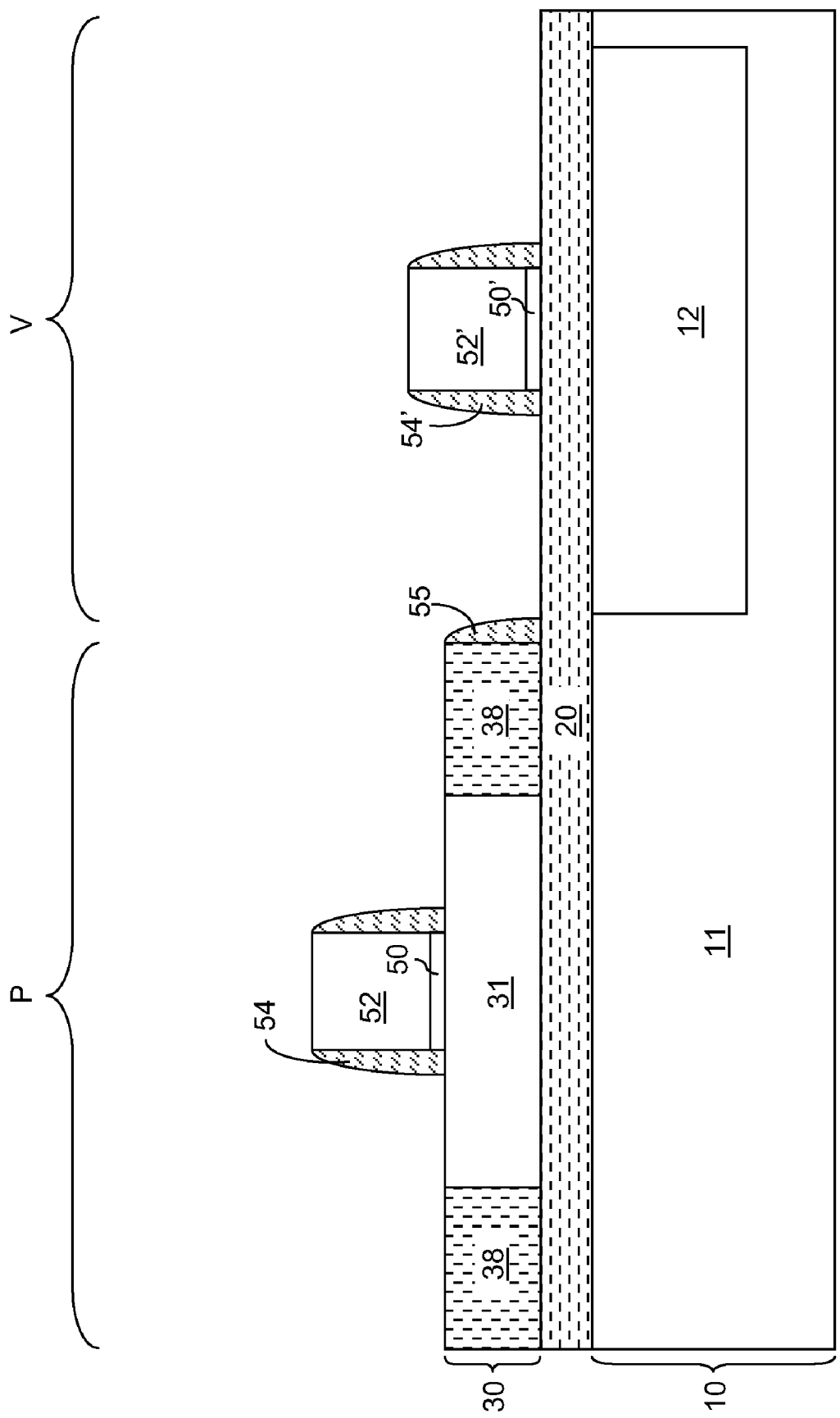

Referring to FIG. 16, halo implantations and/or source and drain extension implantations may be performed into the top semiconductor portion 31 and/or the second bottom semiconductor portion 12 with or without an implantation mask (not shown). Halo regions (not shown) and/or source and drain extension regions (not shown) may be formed in the top semiconductor portion 31 and/or the second bottom semiconductor portion 12. The same methods may be employed to form the halo regions and/or the source and drain extension regions as in the first embodiment.

Subsequently, a first dielectric gate spacer 54, a second gate dielectric spacer 54', and a dielectric spacer 55 are formed by a substantially conformal deposition of a dielectric material layer (not shown), followed by an anisotropic ion etch, which removes horizontal portions of the dielectric material layer. The same methods may be employed to form the first dielectric gate spacer 54, the second gate dielectric spacer 54', and the dielectric spacer 55 as in the first embodiment.

Figure 17:
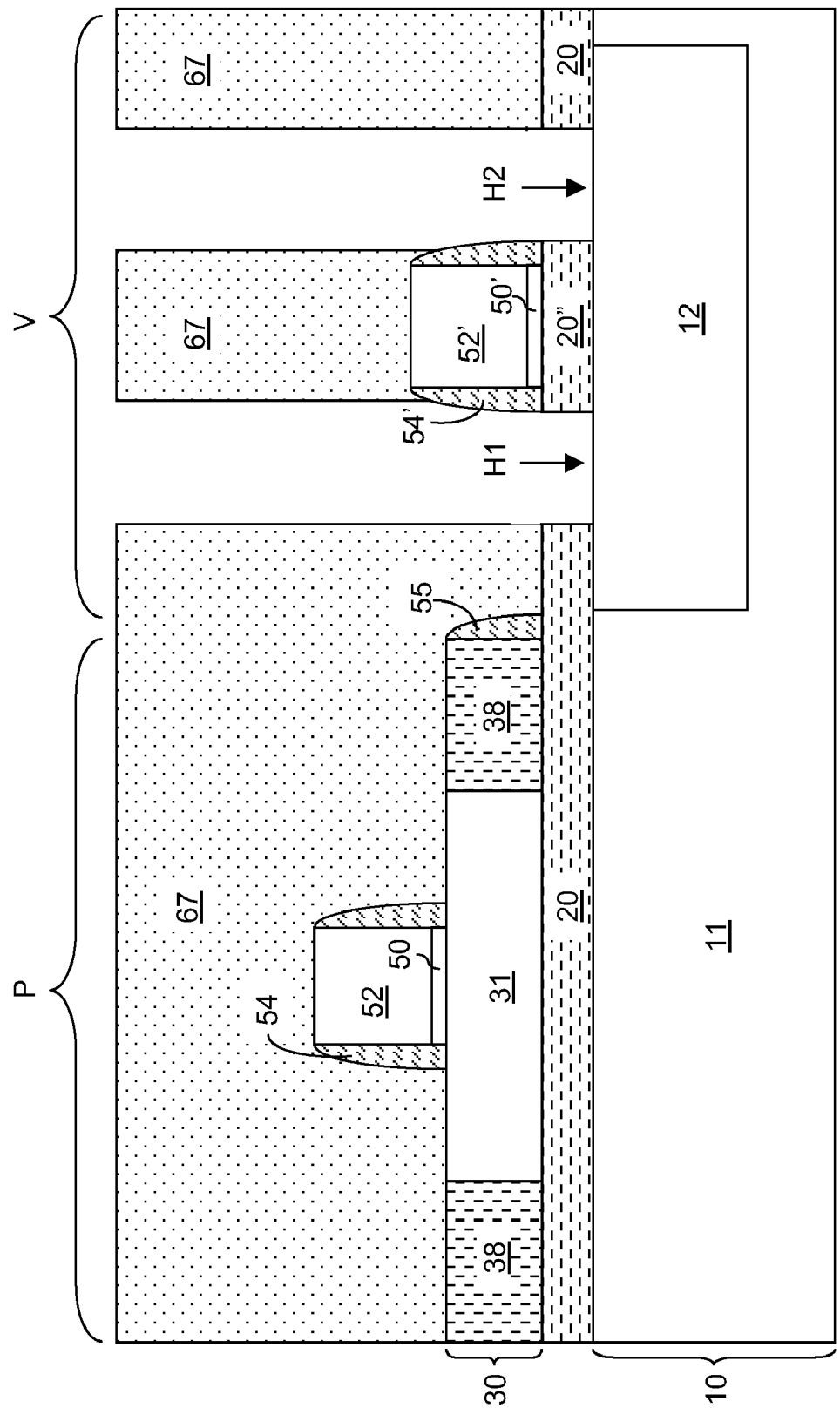

Referring to FIG. 17, a second photoresist 67 is applied over the top surfaces of the first exemplary semiconductor structure and lithographically patterned to provide at least two openings in the pattern of the second photoresist 67 in the high voltage device region V. The second photoresist 67 may cover the entirety of the high performance device region P. The at least two openings include a first opening located at one side of the second gate electrode 52' and a second opening located at an opposite side of the first opening relative to the second gate electrode 52'.

Preferably, the edges of the portion of the second photoresist 67 overlying the second gate electrode 52' is located directly on the second dielectric gate spacer 54'. More preferably, the thickness of the second dielectric gate spacer 54' is greater than the overlay tolerance of the lithography process employed to pattern the at least two openings in the second photoresist 67 so that the edges of the portion of the second photoresist 67 overlying the second gate electrode 42 is located directly on the second dielectric gate spacer 54' irrespective of overlay variations in the lithography process.

A first hole H1 is formed underneath the first opening in the second photoresist 67 and a second hole H2 is formed underneath the second opening in the second photoresist 67 by an etch, which is preferably an anisotropic ion etch. At least the second photoresist 67 is employed as an etch mask during the etch. Preferably, a combination of the second photoresist 67 and the second dielectric gate spacer 54' is employed as an etch mask during the etch so that a periphery of the first hole H1 and a periphery of the second hole H2 is formed self-aligned to outer edges of the second dielectric gate spacer 54'. Optionally, dopant ions of the second conductivity type may be implanted into the second bottom semiconductor portion 12, which has a doping of the first conductivity type. The second photoresist 67 is subsequently removed.

The portion of the buried insulator layer 20 directly underlying the second gate electrode 42 and the second dielectric gate spacer 54' is herein referred to as a buried insulator portion 20'', which is of integral construction with the rest of the buried insulator layer 20. The buried insulator portion 20'', being a portion of the buried insulator layer 20, has the same thickness and composition as the rest of the buried insulator layer 20. The set of the buried insulator portion 20'' and the dielectric material portion 50' collectively constitute a second gate dielectric. The set of the second gate dielectric (20'', 50') and the second gate electrode 52' collectively constitute a second gate stack (30'', 50', 52'). The second gate dielectric (20'', 50') functions as a gate dielectric of a field effect transistor as described below.

Figure 18:
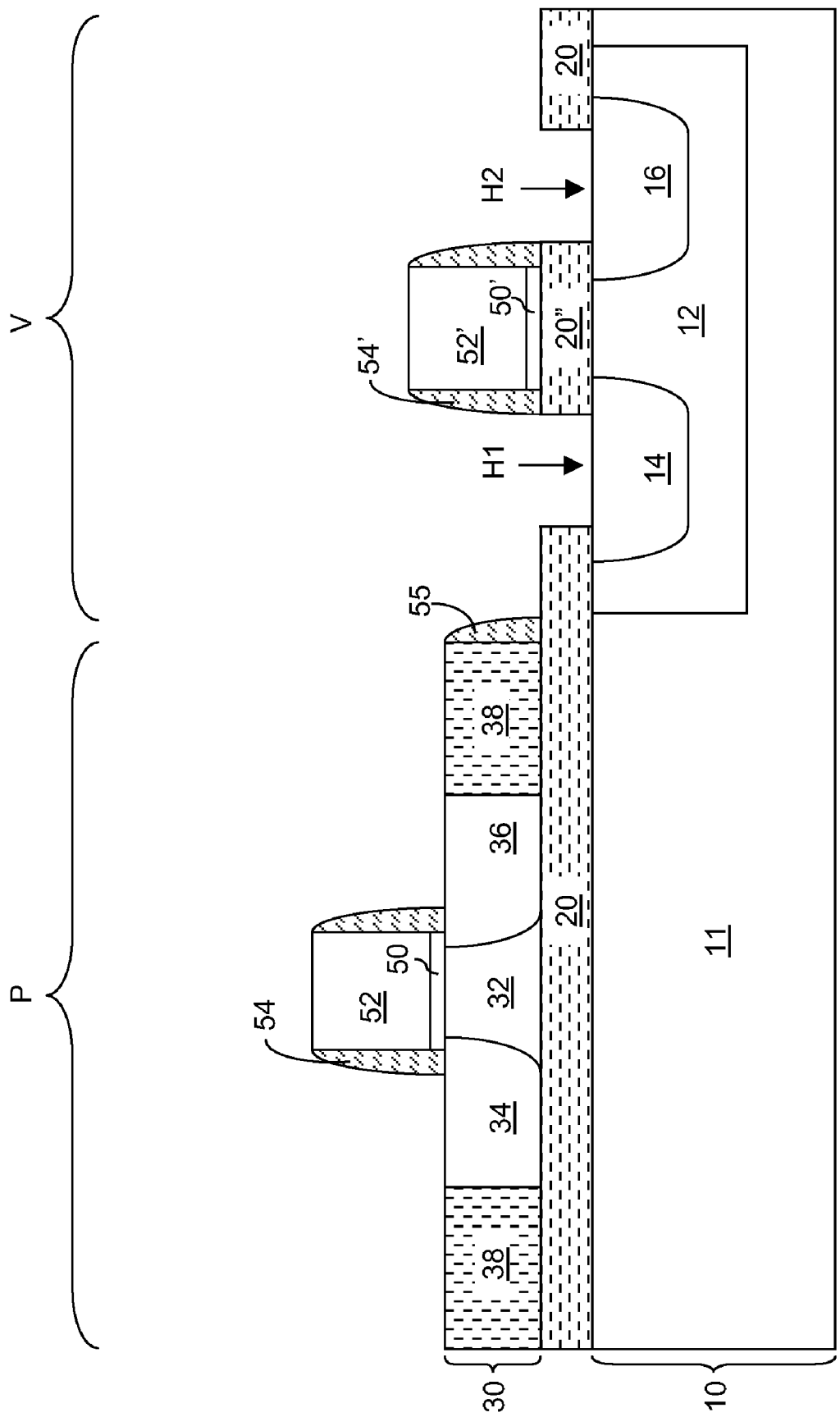

Referring to FIG. 18, various source and drain regions are formed in the first top semiconductor portion 31 (See FIG. 17) and the second bottom semiconductor portion 12 employing at least one blanket ion implantation and/or at least one masked ion implantation. The same methods may be employed to form the various source and drain regions as at the processing step of FIG. 9 in the first embodiment.

Figure 19:
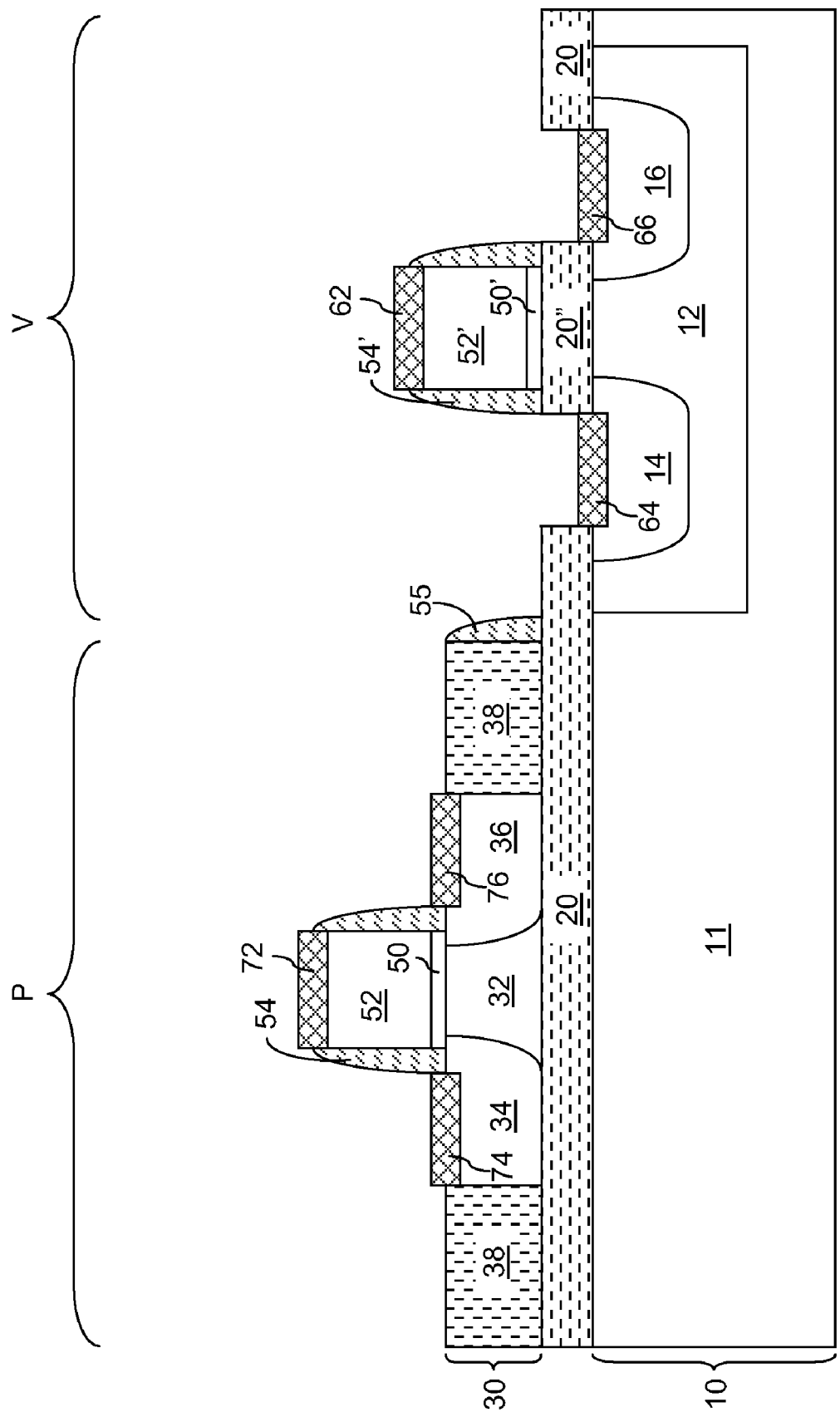

Referring to FIG. 19, various metal semiconductor alloy regions such as metal silicides may be formed on exposed semiconductor surfaces by depositing a metal layer (not shown) over the first exemplary semiconductor structure and inducing formation of such metal semiconductor alloy regions by an anneal through reaction of the metal layer with underlying semiconductor materials. The unreacted portions of the metal layer are subsequently removed selective to the metal semiconductor alloy regions and dielectric materials. The same methods may be employed to form the various metal semiconductor alloy regions as at the processing step of FIG. 10 in the first embodiment. The first gate electrode 52 and the second gate electrode 52' comprise the same semiconductor material and have the same height, and the first gate metal semiconductor alloy region 72 and the second gate metal semiconductor alloy region 62 may have the same composition and thickness.

Figure 20:
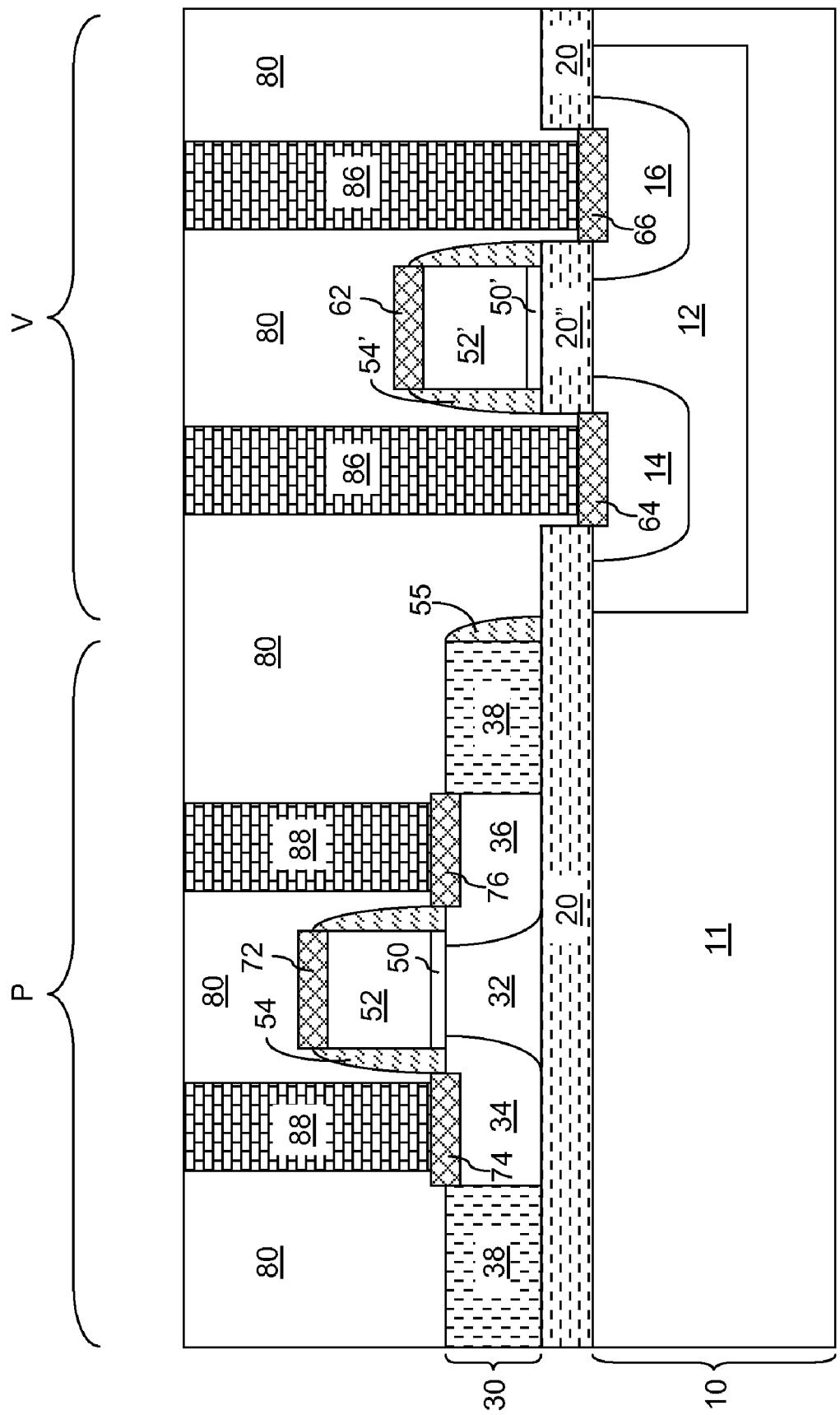

Referring to FIG. 20, a middle-of-line (MOL) dielectric layer 80, first contact vias 88, and second contact vias 86 may be formed in the same manner as in the first embodiment.

The second exemplary semiconductor structure includes the first field effect transistor in the high performance device region P and the second field effect transistor in the high voltage device region V. As in the first embodiment, the first field effect transistor may be optimized for performance, and the second field effect transistor may be optimized for high voltage operation. Since the second gate dielectric (20'', 50') includes the buried insulator portion 20'' which is formed independent of the first gate dielectric 50, the performance parameters of the first field effect transistor and the performance parameters of the second field effect transistor may be optimized independently. Remarks in the description of the first embodiment regarding enablement of high voltage operation for up to 300 V or more apply to the second field effect transistor of the second embodiment as well.

Figure 21:
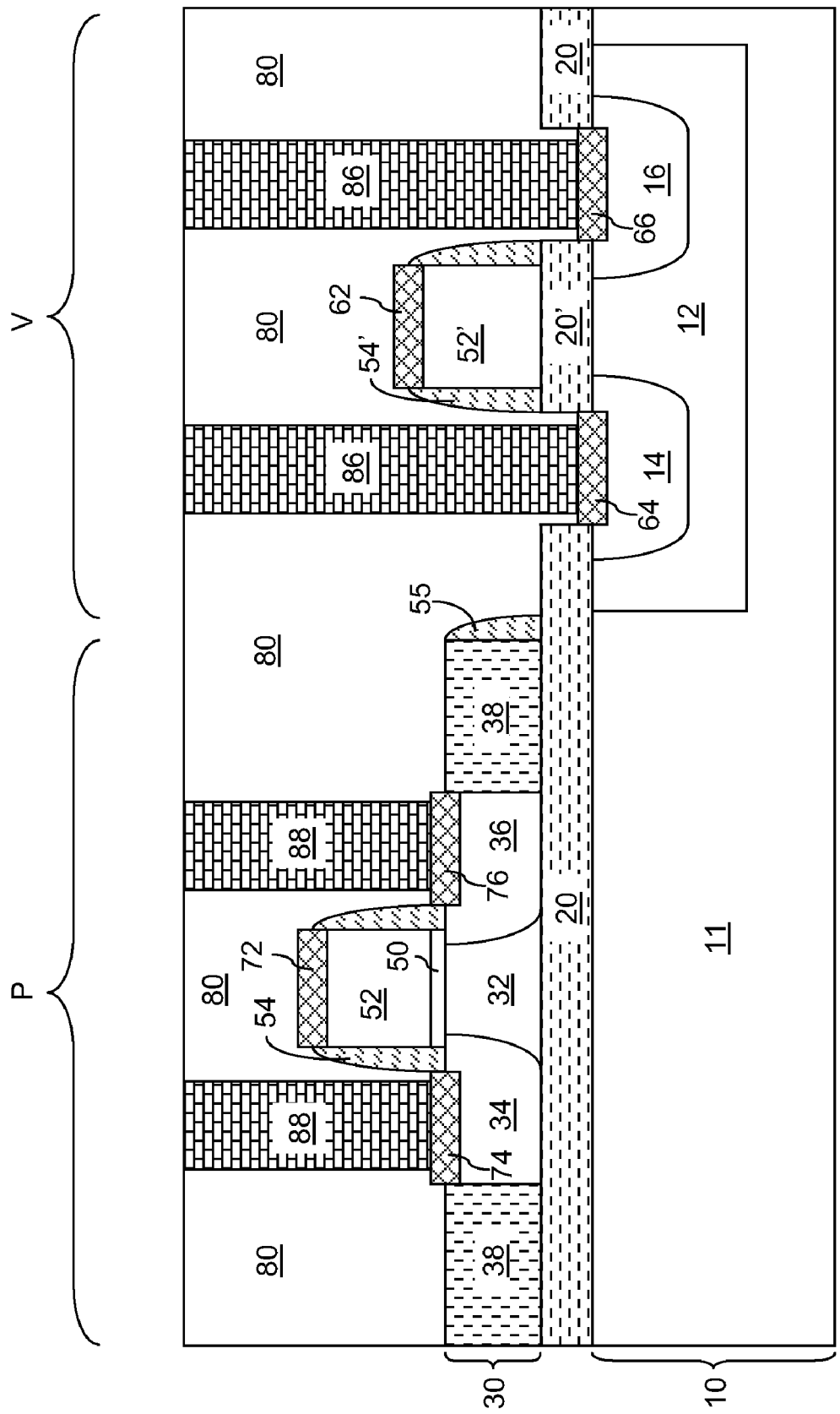
FIG. 21 is a vertical cross-sectional view of a first variation of the second exemplary semiconductor structure, in which a second gate dielectric 20' is formed instead of a stack of a first dielectric material portion 50' and a second dielectric material portion 20".

Referring to FIG. 21, a first variation of the second exemplary semiconductor structure includes a second gate stack, which contains a second gate electrode 52' and a second gate dielectric 20' which is a portion of the buried insulator layer 20. The first variation of the second exemplary semiconductor structure is derived from the second exemplary semiconductor structure described above by employing a gate dielectric layer 50L at a step corresponding to FIG. 14 that is formed only on exposed semiconductor surfaces, i.e., only on the top surface of the first top semiconductor portion 31, for example, by conversion of exposed semiconductor material by thermal oxidation, thermal nitridation, plasma nitridation, plasma oxidation, or a combination thereof.

Figure 22:
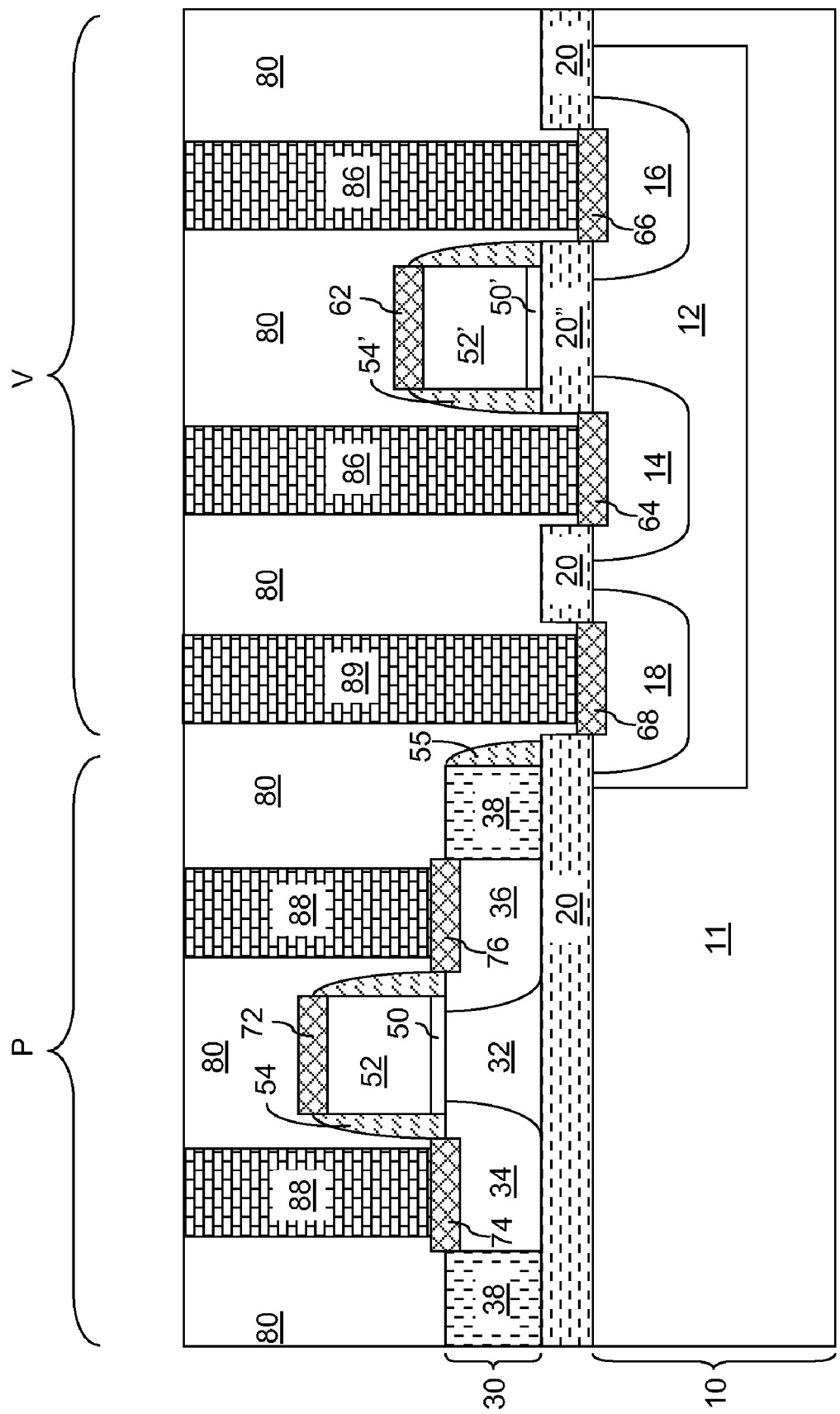
FIG. 22 is a vertical cross-sectional view of a second variation of the second exemplary semiconductor structure.

Referring to FIG. 22, a second variation of the second exemplary semiconductor structure includes a heavily doped semiconductor region 18 formed in an upper portion of the second bottom semiconductor portion 12, a substrate metal semiconductor alloy region 68 formed directly on the heavily doped semiconductor region 18, and a substrate contact via 89 formed directly on the substrate metal semiconductor alloy region 68. To form the heavily doped semiconductor region 18, dopants of the first conductivity type, an additional hole is formed in the buried insulator layer 20 at a step corresponding to FIG. 17 in the high voltage device region V, and dopants of the first conductivity type, i.e., dopants of the same conductivity type as the second bottom semiconductor portion 12, are implanted into an upper portion of the second bottom semiconductor portion 12 through the additional hole at a step corresponding to FIG. 18. The heavily doped semiconductor region 18 is heavily doped to provide Ohmic contact between the second bottom semiconductor portion 12 and the substrate metal semiconductor alloy region 68, and may have a dopant concentration from about $5.0 \times 10^{19}/cm^3$ to about $1.0 \times 10^{21}/cm^3$, and typically from about $1.0 \times 10^{20}/cm^3$ to about $5.0 \times 10^{20}/cm^3$. The substrate metal semiconductor alloy region 68 is formed by reacting the metal layer with the exposed portion of the heavily doped semiconductor region 18 within the additional hole in the buried insulator layer 20. An additional via hole is formed over the substrate metal semiconductor alloy region 68 at a step corresponding to FIG. 20 and filled with a conductive material to form the substrate contact via 89. The second bottom semiconductor portion 12, which is a doped well containing a body region of the second field effect transistor, may be biased to optimize the performance of the second field effect transistor through the substrate contact via 89.

Figure 23:
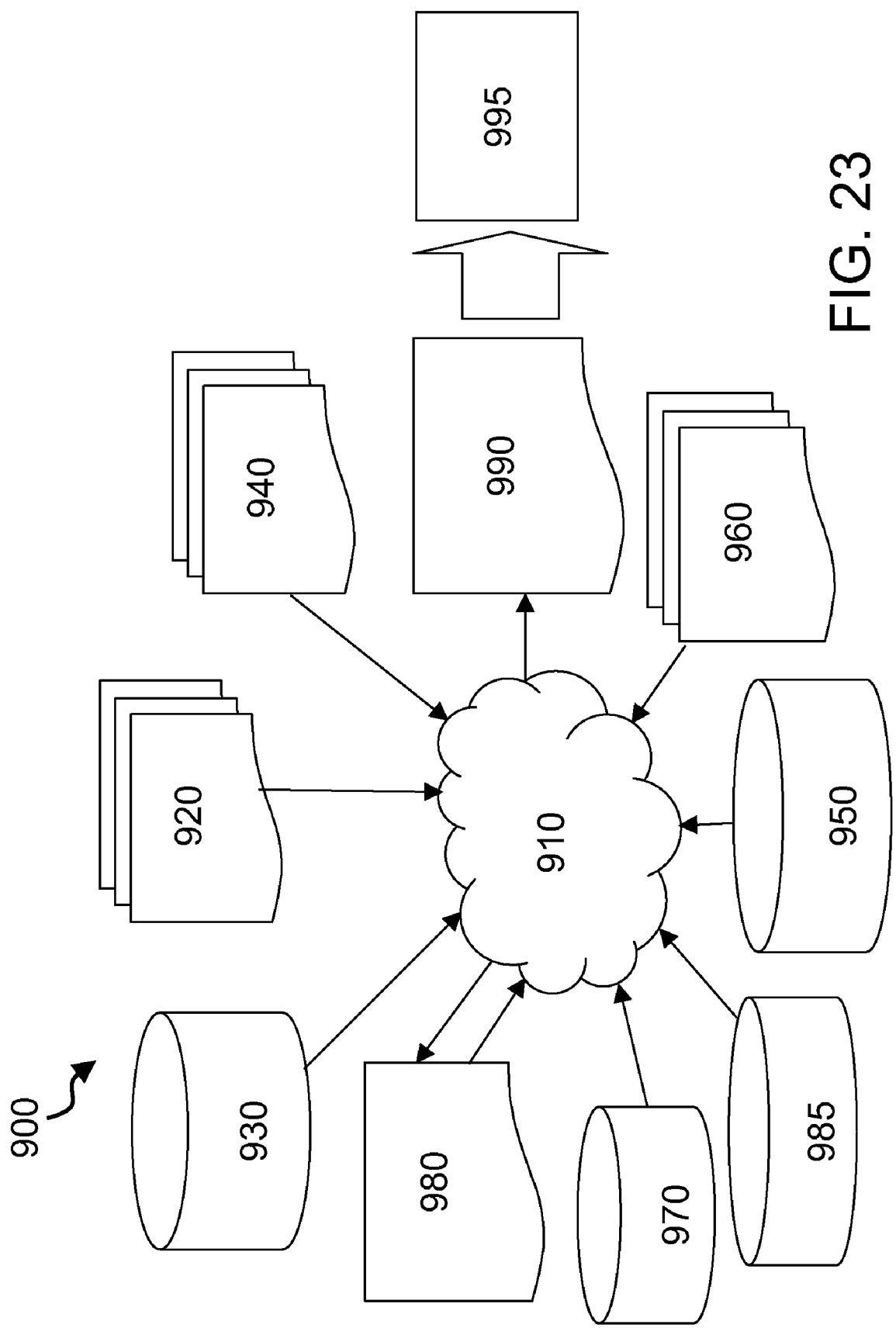
FIG. 23 is a flow diagram of a design process used in semiconductor design and manufacture of the semiconductor structures according to the present invention.

FIG. 23 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-22. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 23 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-22. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-22 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-22. In one embodiment, design structure 990 may comprise a compiled, executable HDL simulation model that functionally simulates the devices shown in FIGS. 1-22.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-22. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
    masking a top semiconductor portion of a top semiconductor layer in a first device region and a portion of said semiconductor layer in a second device region of a semiconductor-on-insulator (SOI) substrate with a masking layer;
    etching exposed portions of said top semiconductor layer in said second device region employing said masking layer as an etch mask, wherein a top surface of a buried insulator layer is exposed around said masked portion of said top semiconductor layer in said second device region;

forming a first hole and a second hole within said buried insulator layer around said masked portion of said top semiconductor layer in said second device region, wherein a top surface of a bottom semiconductor layer is exposed in each of said first hole and said second hole; and forming a source region and a drain region directly underneath said top surfaces of said bottom semiconductor layer, wherein said masked portion of said top semiconductor layer constitutes a gate electrode of a field effect transistor, a portion of said buried insulator layer located directly underneath said gate electrode constitutes a gate dielectric of said field effect transistor, and said source region and said drain region constitute diffusion regions of said field effect transistor, whereby current between said source region and said drain region is controlled by said gate electrode.

2. The method of claim 1, wherein said top semiconductor portion and said gate electrode comprise a same single crystalline semiconductor material having a same set of crystallographic orientations.

3. The method of claim 1, further comprising forming a dielectric gate spacer directly on sidewalls of said masked portion of said top semiconductor layer, wherein a periphery of said first hole and a periphery of said second hole is formed self-aligned to outer edges of said dielectric gate spacer.

4. The method of claim 1, further comprising forming a doped well having a doping of an opposite conductivity type of a conductivity type of said source region and said drain region in said bottom semiconductor layer.

5. The method of claim 1, further comprising:
forming a substrate metal semiconductor alloy region directly on said doped well and within a hole in said dielectric layer; and
forming a substrate contact via directly on said substrate metal semiconductor alloy region.

6. The method of claim 1, further comprising forming another field effect transistor on said top semiconductor portion, wherein said other field effect transistor comprises a stack of another gate dielectric and another gate electrode located directly on a top surface of said top semiconductor portion.

7. The method of claim 6, wherein a source region of said other field effect transistor and a drain region of said other field effect transistor are formed in said top semiconductor portion.

8. The method of claim 6, further comprising:
forming a gate dielectric layer on a top surface of said top semiconductor layer prior to said etching of said exposed portions of said top semiconductor layer;
forming a gate electrode layer directly on said gate dielectric layer; and
patterning said gate electrode layer and said gate dielectric layer, wherein remaining portions of said gate electrode layer and said gate dielectric layer constitute said stack of said other gate dielectric and said other gate electrode.

9. The method of claim 8, wherein said gate dielectric layer comprises at least one of a silicon oxide based dielectric material and a metal oxide based dielectric material having a dielectric constant greater than 8.0, and wherein said buried insulator layer comprises silicon oxide having a thickness from about 30 nm to about 300 nm.

10. The method of claim 1, further comprising:
forming a source side metal semiconductor alloy region directly on said source region and in said first hole;
forming a drain side metal semiconductor alloy region directly on said drain region and in said second hole;
forming a contact via directly on said source side metal semiconductor alloy region; and
forming another contact via directly on said drain side metal semiconductor alloy region.

11. A method of forming a semiconductor structure comprising:
masking a top semiconductor portion of a top semiconductor layer in a first device region of a semiconductor-on-insulator (SOI) substrate with a masking layer;
etching exposed portions of said top semiconductor layer in said second device region employing said masking layer as an etch mask, wherein a top surface of a buried insulator layer is exposed in an entirety of said second device region;
forming a gate electrode above a portion of said top surface of said buried insulator layer in said second device region;
forming a first hole and a second hole within said buried insulator layer around said gate electrode, wherein a top surface of a bottom semiconductor layer is exposed in each of said first hole and said second hole; and
forming a source region and a drain region directly underneath said top surfaces of said bottom semiconductor layer, wherein a portion of said buried insulator layer located directly underneath said gate electrode constitutes at least a portion of a gate dielectric of a field effect transistor, and said source region and said drain region constitute diffusion regions of said field effect transistor, whereby current between said source region and said drain region is controlled by said gate electrode.

12. The method of claim 11, wherein said gate electrode is formed directly on said portion of said top surface of said buried insulator layer in said second device region, and wherein said portion of said buried insulator layer located directly underneath said gate electrode constitutes an entirety of said gate dielectric.

13. The method of claim 11, further comprising forming a dielectric material portion directly on said portion of said top surface of said buried insulator layer in said second device region, and wherein said portion of said buried insulator layer located directly underneath said gate electrode and said dielectric material portion collectively constitute said gate dielectric of said field effect transistor.

14. The method of claim 11, further comprising forming a dielectric gate spacer directly on sidewalls of said gate electrode, wherein a periphery of said first hole and a periphery of said second hole is formed self-aligned to outer edges of said dielectric gate spacer.

15. The method of claim 11, further comprising forming a doped well having a doping of an opposite conductivity type of a conductivity type of said source region and said drain region in said bottom semiconductor layer.

16. The method of claim 11, further comprising:
forming a substrate metal semiconductor alloy region directly on said doped well and within a hole in said dielectric layer; and
forming a substrate contact via directly on said substrate metal semiconductor alloy region.

17. The method of claim 11, further comprising forming another field effect transistor on said top semiconductor portion, wherein said other field effect transistor comprises a stack of another gate dielectric and another gate electrode located directly on a top surface of said top semiconductor portion.

18. The method of claim 17, further comprising:
 forming a gate dielectric layer on a top surface of said top semiconductor portion after etching of said exposed portions of said top semiconductor layer in said second device region;
 forming a gate electrode layer on said gate dielectric layer in said first device region and said second device region; and
 patterning said gate electrode layer and said gate dielectric layer, wherein remaining portions of said gate electrode layer and said gate dielectric layer in said first device region constitute said stack of said other gate dielectric and said other gate electrode, and wherein a remaining portion of said gate electrode layer in said second device region constitute said second gate electrode.

19. The method of claim 18, wherein said gate dielectric layer comprises at least one of a silicon oxide based dielectric material and a metal oxide based dielectric material having a dielectric constant greater than 8.0, and wherein said buried insulator layer comprises silicon oxide having a thickness from about 30 nm to about 300 nm.

20. The method of claim 11, further comprising:
 forming a source side metal semiconductor alloy region directly on said source region and in said first hole;
 forming a drain side metal semiconductor alloy region directly on said drain region and in said second hole;
 forming a contact via directly on said source side metal semiconductor alloy region; and
 forming another contact via directly on said drain side metal semiconductor alloy region.

* * * * *